United States Patent
Nakashiba et al.

(10) Patent No.: US 9,927,573 B2
(45) Date of Patent: Mar. 27, 2018

(54) SEMICONDUCTOR DEVICE

(71) Applicant: Renesas Electronics Corporation, Koutou-ku, Tokyo (JP)

(72) Inventors: Yasutaka Nakashiba, Ibaraki (JP); Shinichi Watanuki, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/188,914

(22) Filed: Jun. 21, 2016

(65) Prior Publication Data

US 2017/0031095 A1 Feb. 2, 2017

(30) Foreign Application Priority Data

Jul. 30, 2015 (JP) .................. 2015-150437

(51) Int. Cl.
| | |
|---|---|
| *G02B 6/122* | (2006.01) |
| *G02B 6/12* | (2006.01) |
| *G02B 6/132* | (2006.01) |
| *G02F 1/025* | (2006.01) |
| *G02F 1/015* | (2006.01) |
| *H01L 31/0248* | (2006.01) |

(52) U.S. Cl.
CPC ......... *G02B 6/122* (2013.01); *G02B 6/12004* (2013.01); *G02B 6/132* (2013.01); *G02F 1/025* (2013.01); *H01L 31/0248* (2013.01); *G02B 2006/12061* (2013.01); *G02B 2006/12097* (2013.01); *G02F 2001/0152* (2013.01); *G02F 2202/103* (2013.01); *G02F 2202/104* (2013.01)

(58) Field of Classification Search
CPC .... G02B 6/122; G02B 6/132; G02B 6/12004; G02B 2006/12061; G02B 2006/12097; H01L 31/0248; G02F 1/025; G02F 2202/103; G02F 2202/104; G02F 2001/0152

See application file for complete search history.

(56) References Cited

U.S. PATENT DOCUMENTS

| | | | |
|---|---|---|---|
| 7,440,180 B2* | 10/2008 | Tang | H01S 3/0632 359/344 |
| 8,909,021 B2* | 12/2014 | Saito | G02B 6/122 385/147 |

FOREIGN PATENT DOCUMENTS

JP 2012-027198 A 2/2012

* cited by examiner

*Primary Examiner* — John M Bedtelyon
(74) *Attorney, Agent, or Firm* — Shapiro, Gabor & Rosenberger, PLLC

(57) ABSTRACT

An SOI substrate includes a base substrate, a polycrystalline silicon layer formed on the base substrate, an insulating layer formed on the polycrystalline silicon layer, and a semiconductor layer formed on the insulating layer, and optical waveguides are formed in the semiconductor layer of the SOI substrate. Thus, by arranging the polycrystalline silicon layer under the insulating layer, the insulating layer can be made thin. Since the polycrystalline silicon layer includes a plurality of grains (a mass of grains made of a single crystal Si), even when leakage of light is generated beyond the insulating layer, reflection (diffusion) of light can be suppressed. In addition, by arranging the polycrystalline silicon layer under the insulating layer, the insulating layer can be made thin, so that distortion of a substrate can be suppressed.

14 Claims, 27 Drawing Sheets

SEMICONDUCTOR DEVICE

CROSS-REFERENCE TO RELATED APPLICATION

The present application claims priority from Japanese Patent Application No. 2015-150437 filed on Jul. 30, 2015, the content of which is hereby incorporated by reference into this application.

TECHNICAL FIELD OF THE INVENTION

The present invention relates to a semiconductor device and a method of manufacturing the same and can be suitably utilized, for example, for a semiconductor device including optical waveguides and a method of manufacturing the same.

BACKGROUND OF THE INVENTION

In recent years, a silicon photonics technique has been developed. This silicon photonics technique is a technique in which an optical device and an electronic device are connected by an optical circuit which uses optical waveguides made of silicon as a material. Thus, a semiconductor device in which an optical device and an electronic device are connected by using an optical circuit and on which these are mounted is referred to as a module for optical communication.

Of such semiconductor devices, there is a semiconductor device including optical waveguides composed of a semiconductor layer formed on abase substrate via an insulating layer as a transmission line for an optical signal and an insulating film formed to cover the optical waveguides. At this time, the optical waveguides serve as a core layer, and the insulating layer and the insulating film serve as cladding layers.

Japanese Patent Application Laid-Open Publication No. 2012-27198 (Patent Document 1) discloses an optical semiconductor device including a semiconductor layer which is an intrinsic semiconductor formed on a substrate, and optical waveguides which are parts of the semiconductor layer.

SUMMARY OF THE INVENTION

Through the optical waveguides made of silicon as a material, light partially leaks out to the periphery approximately in the same range as a wavelength of light during propagation through the optical waveguides. In order to reduce a propagation loss due to the leakage of light, the peripheries (left, right, top, and bottom) of the optical waveguides are covered with an insulating film made of silicon oxide.

Accordingly, a configuration in which lower sides of the optical waveguides are covered with a thick insulating layer by using a so-called SOI substrate has been studied.

However, forming a thick insulating layer is difficult and becomes a cause of a cost increase. In addition, in a process of forming a semiconductor device, processing a thick insulating layer becomes difficult. Moreover, when an insulating layer is thick, distortion of the substrate is likely to occur, so that the thick insulating layer may cause a variety of defects in a process of forming a semiconductor device.

The other problems and novel characteristics of the present invention will be apparent from the description of the present specification and the accompanying drawings.

A summary of a typical one of the embodiments disclosed in the present application will be described in brief as follows:

A semiconductor device indicated in one embodiment disclosed in the present application includes: a base substrate; a polycrystalline silicon layer formed on the base substrate; an insulating layer formed on the polycrystalline silicon layer; a semiconductor layer formed on the insulating layer; and an optical waveguide formed in the semiconductor layer.

According to a semiconductor device indicated in a typical one of the embodiments disclosed in the present application, the characteristics of the semiconductor device can be improved.

BRIEF DESCRIPTIONS OF THE DRAWINGS

DESCRIPTIONS OF THE PREFERRED EMBODIMENTS

Figure 1:
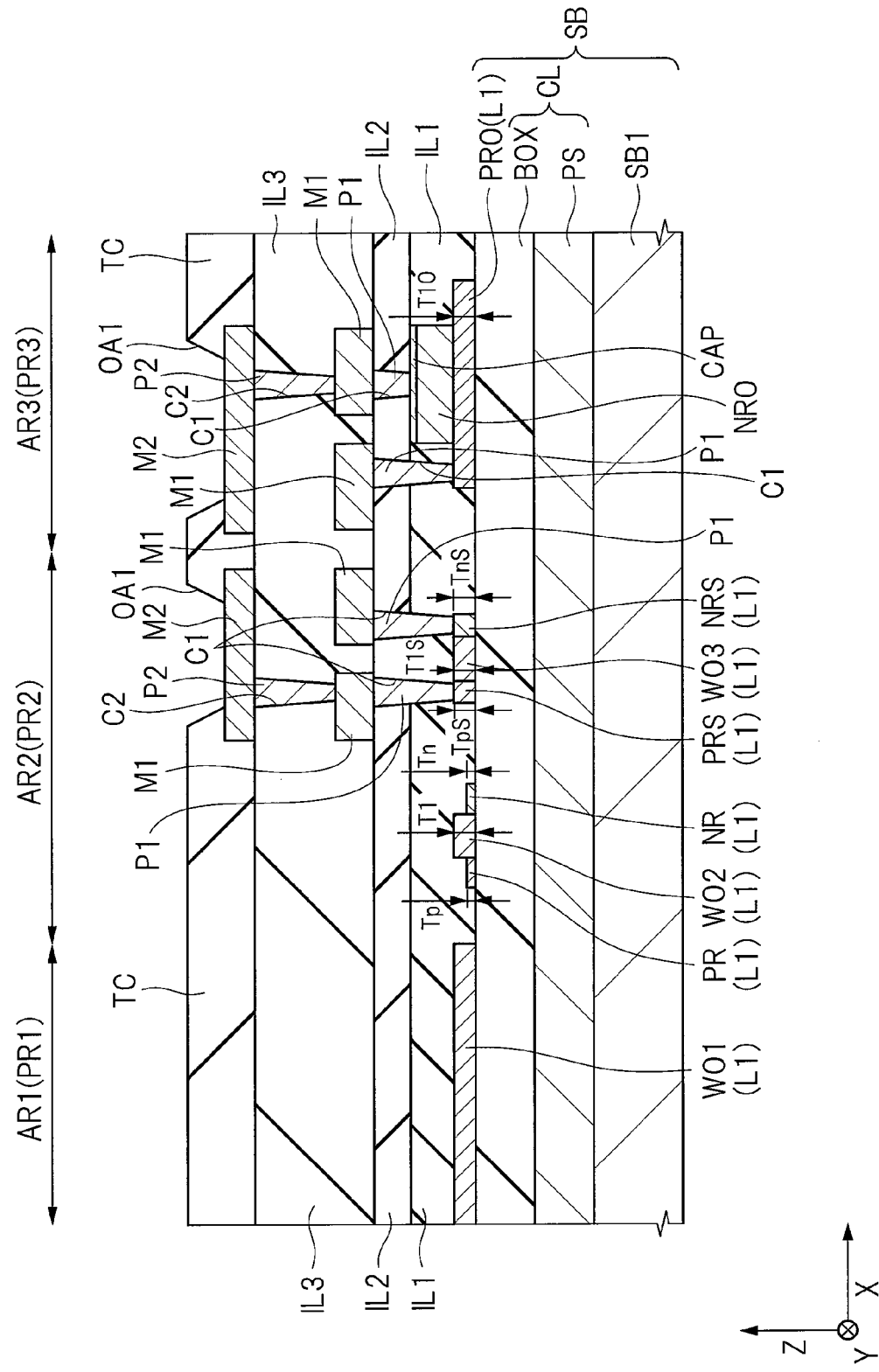
FIG. 1 is a cross-sectional view showing a configuration of a semiconductor device of a first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps and the like) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and others described above (including number of pieces, values, amount, range, and the like).

Hereinafter, embodiments of the present invention will be described in detail with reference to the accompanying drawings. Note that, in all the drawings for describing the embodiments, members having the same function are denoted by the same or related reference characters, and the repeated descriptions thereof will be omitted. Also, when a plurality of similar members (portions) are present, a symbol is added to a reference character of a collective term to indicate an individual or specific portion, in some cases. Also, the description of the same or similar parts will not be repeated in principle unless particularly required in the embodiments described below.

Also, in some drawings used in the embodiments, hatching is omitted even in a cross-sectional view so as to make the drawings easy to see.

Moreover, in cross-sectional views and plan views, a size of each portion does not correspond to that of an actual device, and a specific portion is shown relatively largely so as to make the drawings easy to see, in some cases. Further, even when a plan view corresponds to a cross-sectional view, a specific portion is shown relatively largely so as to make the drawings easy to see, in some cases.

First Embodiment

Hereinafter, a semiconductor device of the present embodiment will be described in details with reference to the drawings.

[Description of Structure]

FIG. 1 is a cross-sectional view showing a configuration of a semiconductor device of the present embodiment. The semiconductor device shown in FIG. 1 is a semiconductor device (optical semiconductor device) including optical waveguides composed of a semiconductor layer.

As shown in FIG. 1, the semiconductor device of the present embodiment includes an optical signal transmission line section PR1, an optical modulation section PR2, and a photoelectric conversion section PR3 formed in regions AR1, AR2, and AR3 of an SOI (Silicon on Insulator) substrate SB, respectively. The SOI substrate SB is constituted by a base substrate SB1, a polycrystalline silicon layer (polysilicon layer) PS formed on the base substrate SB1, an insulating layer (Buried Oxide) BOX formed on the polycrystalline silicon layer PS, and a semiconductor layer L1 formed on the insulating layer BOX.

As the base substrate (also referred to as a supporting substrate) SB1, a silicon (Si) single-crystal substrate can be used, for example. For example, a p-type Si single-crystal substrate having a plane direction of (100) and a resistivity of approximately 5 to 50 Ωcm can be used as the base substrate SB1.

The polycrystalline silicon layer PS can be formed on the base substrate SB1 by the CVD (Chemical Vapor Deposition), for example. The film thickness of the polycrystalline silicon layer PS is approximately 1 μm, for example.

As the insulating layer BOX, a silicon oxide ($SiO_2$) film can be used, for example. The film thickness of the insulating layer BOX is approximately 1 to 1.5 μm, for example.

The polycrystalline silicon layer PS and the insulating layer BOX serve as cladding layers CL which cover the peripheries of the optical waveguides (core layer) described later.

Hereinafter, each configuration of the optical signal transmission line section PR1, the optical modulation section PR2, and the photoelectric conversion section PR3 will be described.

<Transmission Line Section for an Optical Signal>

The optical signal transmission line section PR1 is formed in the region AR1 (FIG. 1). In this region AR1, an optical waveguide WO1 is formed. The optical waveguide WO1 is formed in the semiconductor layer L1.

Specifically, the optical waveguide WO1 is composed of the semiconductor layer L1 formed on the insulating layer BOX. Note that an impurity ion is not implanted into the optical waveguide WO1. In other words, the optical waveguide WO1 is composed of an intrinsic semiconductor, that is, an i (intrinsic)-type region. The optical waveguide WO1 is formed into a linear shape in an X direction (rectangular shape having long sides in the X direction), for example.

Here, in an optical waveguide composed of a semiconductor layer (for example, silicon) as a material, light partially leaks out to the periphery approximately in the same range as a wavelength of light during propagation through the optical waveguide, and this leakage of light may generate a propagation loss of an optical signal. In order to reduce such a propagation loss of an optical signal, the peripheries (left, right, top, and bottom) of the optical waveguides have to be covered with a layer having a low refractive index (here, cladding layer CL). Accordingly, thick silicon oxide films, for example, are arranged on the top and bottom of the optical waveguides. In addition, in order to prevent interference of light, a space of approximately 5 μm, for example, is ensured between the optical waveguides. A silicon oxide film is arranged between the optical waveguides. A refractive index n of the silicon oxide film is approximately 1.45.

However, in the present embodiment, by arranging the polycrystalline silicon layer PS under the insulating layer BOX, the insulating layer BOX can be made thin. Since the polycrystalline silicon layer PS has a plurality of grains (a mass of grains made of a single crystal Si), even when leakage of light is generated beyond the insulating layer BOX, reflection of light can be suppressed. In addition, even when leakage of light (penetration or evanescent) is generated beyond the insulating layer BOX, incident light irregularly reflects in the gap between the grains, thereby suppressing reflection (diffusion) of light. As described later, when a single insulating layer BOX is used as a cladding layer (see FIG. 11), it is required to form the insulating layer BOX having a film thickness of 2 to 3 μm. When such a thick insulating layer BOX is formed, a long-time oxidizing process is needed, thereby requiring time and cost in forming an SOI substrate. In contrast, in the present embodiment, by arranging the polycrystalline silicon layer PS under the insulating layer BOX, the insulating layer BOX can be made thin, and a film thickness thereof can be set to be approximately 1 to 1.5 μm, for example.

In addition, when a thick insulating layer BOX is provided, film stress increases, so that distortion of the substrate is likely to occur. In contrast, by replacing a part of the insulating layer BOX by the polycrystalline silicon layer PS, film stress due to the insulating layer BOX can be mitigated, thereby suppressing distortion of the substrate. Hence, destruction of elements and poor exposure due to distortion of the substrate can be suppressed.

Interlayer dielectric films IL1, IL2, and IL3, and a protective film TC are formed over the optical waveguide WO1. Note that the interlayer dielectric films IL1, IL2, and IL3 are composed of a silicon oxide film, for example. In addition, the protective film TC is composed of a silicon oxynitride film (SiON film), for example.

<Optical Modulation Section>

The optical modulation section PR2 is formed in the region AR2 (FIG. 1). In this region AR2, an element which changes phase of light is formed. Here, an element with a pin structure will be described by way of example but is not limited to this.

In the region AR2, an optical waveguide WO2, a p-type semiconductor section PR, and an n-type semiconductor portion NR are formed (FIG. 1). An element with a pin structure (diode with a pin structure) is constituted by them.

The optical waveguide WO2 is composed of the semiconductor layer L1 formed on the insulating layer BOX. The optical waveguide WO2 is formed into a linear shape in a Y direction (rectangular shape having long sides in the Y direction), for example.

The semiconductor portions (PR and NR) are provided on both sides of the optical waveguide WO2. Here, the p-type semiconductor portion PR is provided on one side (left side in FIG. 1) of the optical waveguide WO2. Also, the n-type semiconductor portion NR is provided on the other side (right side in FIG. 1) of the optical waveguide WO2. For example, the semiconductor portions (PR and NR) are provided on the end of the optical waveguide WO2 linearly extending in the Y direction. Note that an impurity ion is not implanted into the optical waveguide WO2. In other words, the optical waveguide WO2 is composed of an intrinsic semiconductor, that is, an i-type region.

Thus, by providing a structure portion (diode with a pin structure or rib-type element) composed of the optical waveguide WO2, and the p-type semiconductor portion PR and the n-type semiconductor portion NR on both sides thereof, phase of light can be changed. Note that plugs (not shown) are formed on the p-type semiconductor portion PR and the n-type semiconductor portion NR described later, respectively. An electric potential is applied to this plug (P1) via wires and the like (for example, M1, P2, and M2).

For example, when a forward bias voltage is applied to the above structure portion, carriers are implanted into the optical waveguide WO2. When the carriers are implanted into the optical waveguide WO2, carrier plasma effect, that is, a phenomenon resulted from increase of electron-hole pairs (plasma) by optically generated carriers, occurs in the optical waveguide WO2, so that the refractive index of light in the optical waveguide WO2 changes. When the refractive index of light in the optical waveguide WO2 changes, the wavelength of light traveling through the optical waveguide WO2 changes, so that phase of light can be changed in the course of traveling through the optical waveguide WO2.

Here, the above structure portion is processed into a rib type (projecting type). The optical waveguide WO2 is composed of the semiconductor layer L1 having a film thickness T1 thicker than the p-type semiconductor portion PR and the n-type semiconductor portion NR described later. In contrast, the p-type semiconductor portion PR is composed of the semiconductor layer L1 having a film thickness Tp and containing p-type impurities. Also, the n-type semiconductor portion NR is composed of the semiconductor layer L1 having a film thickness Tn and containing n-type impurities. That is, the film thickness (height) T1 of the optical waveguide WO2 is larger than the film thickness (height) Tp of the p-type semiconductor portion PR. Moreover, the film thickness (height) T1 of the optical waveguide WO2 is larger than the film thickness (height) Tn of the n-type semiconductor portion NR. The film thicknesses T1, Tp, and Tn have a relation of T1>Tp≈Tn.

The optical waveguide WO3 is composed of the semiconductor layer L1 formed on the insulating layer BOX, like the optical waveguide WO2. The optical waveguide WO3 is also formed into a linear shape in the Y direction (rectangular shape having long sides in the Y direction), for example, like the optical waveguide WO2.

As described above, the semiconductor portions (PRS and NRS) are provided on both sides of the optical waveguide WO3. Here, the p-type semiconductor portion PRS is provided on one side (left side in FIG. 1) of the optical waveguide WO3. Also, the n-type semiconductor portion NRS is provided on the other side (right side in FIG. 1) of the optical waveguide WO3. For example, the semiconductor portions (PRS and NRS) are provided on the end of the optical waveguide WO3 linearly extending in the Y direction. Note that an impurity ion is not implanted into the optical waveguide WO3. In other words, the optical waveguide WO3 is composed of an intrinsic semiconductor, that is, an i-type region.

Thus, by providing a structure portion (diode with a pin structure) composed of the optical waveguide WO3, and the p-type semiconductor portion PRS and the n-type semiconductor portion NRS on both sides thereof, phase of light can be changed.

For example, when a forward bias voltage is applied to the above structure portion, carriers are implanted into the optical waveguide WO3. When the carriers are implanted into the optical waveguide WO3, carrier plasma effect, that is, a phenomenon resulted from increase of electron-hole pairs (plasma) by optically generated carriers, occurs in the optical waveguide WO3, so that the refractive index of light in the optical waveguide WO3 changes. When the refractive index of light in the optical waveguide WO3 changes, the wavelength of light traveling through the optical waveguide WO3 changes, so that phase of light can be changed in the course of traveling through the optical waveguide WO3.

Here, the optical waveguide WO3 of the above structure portion is composed of the semiconductor layer L1 having a film thickness T1S. Also, the p-type semiconductor portion PRS is composed of the semiconductor layer L1 having a film thickness TpS and containing p-type impurities. Moreover, the n-type semiconductor portion NRS is composed of the semiconductor layer L1 having a film thickness TnS and containing n-type impurities. In this case, the film thickness (height) T1S of the optical waveguide WO3 is approximately as large as the film thickness (height) TpS of the p-type semiconductor portion PRS. Further, the film thickness (height) T1S of the optical waveguide WO3 is approximately as large as the film thickness (height) InS of the n-type semiconductor portion NRS. The film thicknesses T1S, TpS, and TnS have a relation of T1S≈TpS≈TnS.

In addition, a plug P1 is formed on the p-type semiconductor portion PRS. An electric potential is applied to the p-type semiconductor portion PRS via this plug P1. Moreover, another plug P1 is formed on the n-type semiconductor portion NRS. An electric potential is applied to the n-type semiconductor portion NRS via this plug P1.

Also, the above plugs P1 are composed of a conductive film embedded in contact holes C1 provided in the interlayer dielectric films IL1 and IL2. As the conductive film, a tungsten (W) film can be used, for example. Also, wires M1 of the first layer are formed on the plugs P1. The wires M1 are composed of a conductive film, and an aluminium-copper alloy (Al—Cu alloy) film can be used as the conductive film, for example.

The interlayer dielectric film IL3 is formed on the interlayer dielectric film IL2 and the wires M1. Also, a plug P2 is formed on the wire M1. The plug P2 is composed of a conductive film embedded in a contact hole C2 provided in the interlayer dielectric film IL3. As the conductive film, a tungsten (W) film can be used, for example. Also, a wire M2 of the second layer is formed on the plug P2. The wire M2 is composed of a conductive film, and an aluminium-copper alloy (Al—Cu alloy) film can be used as the conductive film, for example.

The protective film TC is formed on the interlayer dielectric film IL3 and the wire M2. Note that the interlayer dielectric films IL1, IL2, and IL3 are composed of a silicon oxide film, for example. Also, the protective film TC is composed of a silicon oxynitride film, for example. The protective film TC on the partial region of the wire M2 is removed, and an opening portion OA1 reaching the wire M2 is provided. The wire M2 is exposed on the bottom part of the opening portion OA1, and the exposed region of the wire M2 serves as a pad portion (external connection portion).

<Photoelectric Conversion Section>

As shown in FIG. 1, the photoelectric conversion section PR3 is formed in the region AR3. The photoelectric conversion section PR3 converts an optical signal into an electric signal. Here, an element with a pn junction structure (photodiode) will be described by way of example but is not limited to this.

A p-type semiconductor portion PRO and an n-type semiconductor portion NRO are formed in the region AR3. They constitute an element with a pn junction structure (diode with a pn structure).

The p-type semiconductor portion PRO is composed of the semiconductor layer L1 containing p-type impurities. Note that the film thickness (height) 110 of the p-type semiconductor portion PRO is approximately as large as the film thicknesses (height) of the optical waveguides WO1, WO2, and WO3 and the film thicknesses (height) of the p-type semiconductor portion PRS and the n-type semiconductor portion NRS. For example, the film thicknesses t1O, T1, T1S, TpS, and TnS have a relation of t1O≈T1≈T1S≈TpS≈TnS. These film thicknesses are relatively large and constitute a thick film portion.

The n-type semiconductor portion NRO is formed on the p-type semiconductor portion PRO. The n-type semiconductor portion NRO is made of germanium (Ge) doped with n-type impurities. Also, a cap layer CAP is formed on the n-type semiconductor portion NRO. The cap layer CAP is made of silicon and formed to improve the surface roughness of germanium contained in the n-type semiconductor portion NRO and supplement the film thickness.

Then, another plug P1 is formed on the p-type semiconductor portion PRO. Also, another plug P1 is formed on the cap layer CAP on the n-type semiconductor portion NRO. These plugs P1 can take out a DC current flowing due to photovoltaic effect generated in the pn junction portion to the outside. That is, an optical signal can be taken out as an electric signal.

Also, the above plugs P1 are composed of a conductive film embedded in contact holes C1 provided in the interlayer dielectric films IL1 and IL2. As the conductive film, a tungsten (W) film can be used, for example. Also, wires M1 of the first layer are formed on the plugs P1. The wires M1 are composed of a conductive film, and an aluminium-copper alloy (Al—Cu alloy) film can be used as the conductive film, for example.

The interlayer dielectric film IL3 is formed on the interlayer dielectric film IL2 and the wires M1. Another plug P2 is formed on the wire M1. The plug P2 is composed of a conductive film embedded in another contact hole C2 provided in the interlayer dielectric film IL3. As the conductive film, a tungsten (W) film can be used, for example. Also, another wire M2 of the second layer is formed on the plug P2. The wire M2 is composed of a conductive film, and an aluminium-copper alloy (Al—Cu alloy) film can be used as the conductive film, for example. Note that an insulating film having a thickness of 2 to 3 µm (silicon oxide, for example) is preferably arranged between the wires M1 and M2 to reduce parasitic capacitance.

The protective film TC is formed on the interlayer dielectric film IL3 and the wire M2. Note that the interlayer dielectric films IL1, IL2, and IL3 are composed of a silicon oxide film, for example. Also, the protective film TC is composed of a silicon oxynitride film, for example. A refractive index n of the silicon oxynitride film (SiON film) is approximately 1.82. The protective film TC on the partial region of the wire M2 is removed, and another opening portion OA1 reaching the wire M2 is provided. The wire M2 is exposed on the bottom part of the opening portion OA1, and the exposed region of the wire M2 serves as another pad portion (external connection portion).

[Description of Manufacturing Method]

Next, a manufacturing process of the semiconductor device of the present embodiment will be described, and in addition, the structure of the semiconductor device of the present embodiment will be made clearer.

FIGS. 2 to 10 are cross-sectional views showing the manufacturing process of the semiconductor device of the present embodiment.

Figure 2:
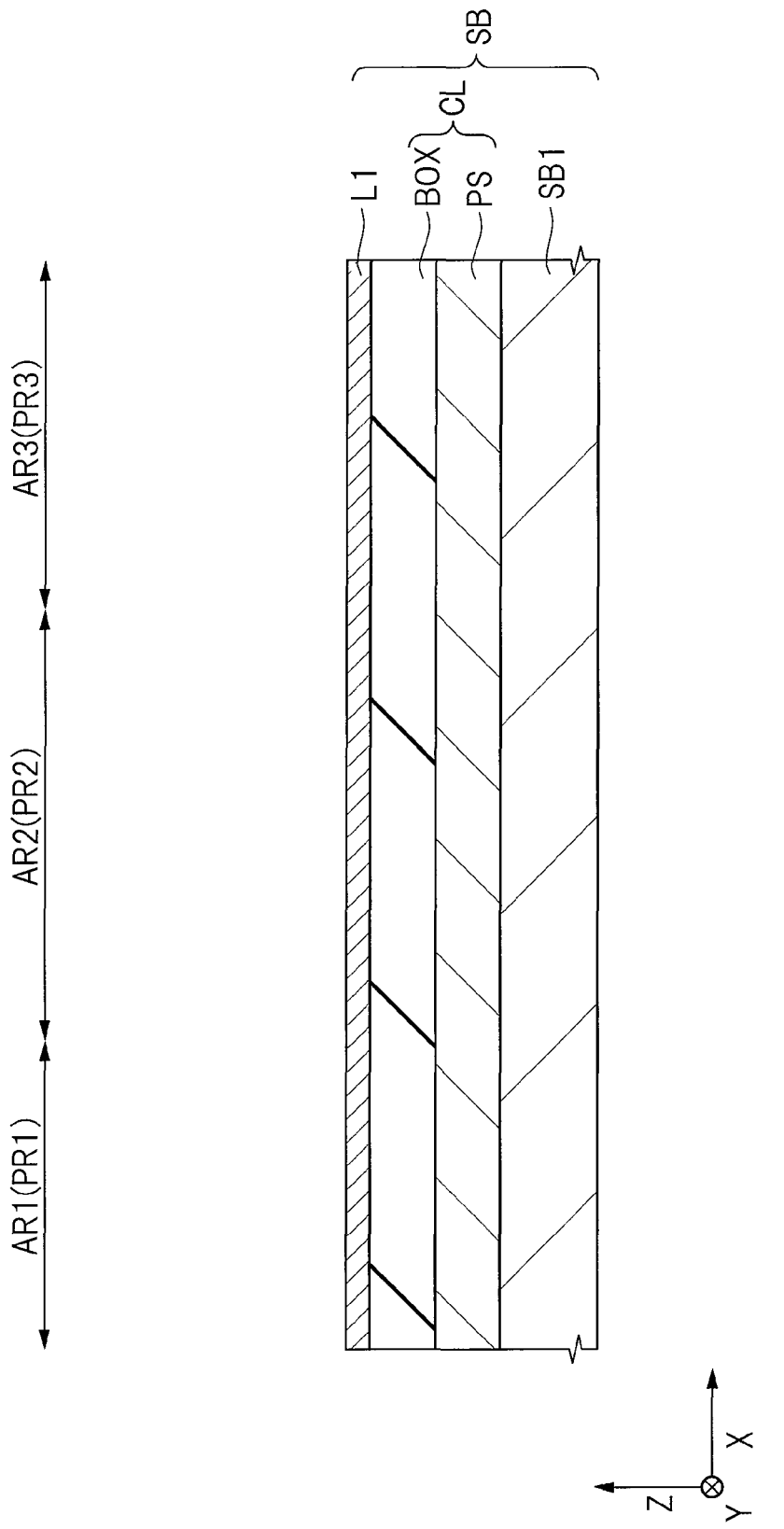
FIG. 2 is a cross-sectional view showing a manufacturing process of the semiconductor device of the first embodiment.

First, as shown in FIG. 2, an SOI substrate SB including a polycrystalline silicon layer (polysilicon layer) PS formed on a base substrate SB1, an insulating layer BOX formed on the polycrystalline silicon layer PS, and a semiconductor layer L1 formed on the insulating layer BOX is prepared. For example, an SOI substrate SB in which a semiconductor layer L1 is formed on a base substrate SB1 composed of a p-type silicon single-crystal substrate having a plane direction of (100) and a resistivity of approximately 5 to 50 Ωcm via a polycrystalline silicon layer (polysilicon layer) PS having a thickness of approximately 1 µm, for example, and a silicon oxide ($SiO_2$) film having a thickness of approximately 1 µm, for example, is prepared. The semiconductor layer L1 is composed of a silicon film having a film thickness of approximately 300 nm formed over the base substrate SB1, for example.

Thus, by arranging the polycrystalline silicon layer PS under the insulating layer BOX, an SOI substrate SB having a thin insulating layer BOX can be used. When such an SOI substrate SB is used, a plurality of grains included in the polycrystalline silicon layer PS can suppress reflection (diffusion) of light leaked out beyond the insulating layer BOX.

Also, when a thick insulating layer BOX is provided, film stress increases, so that distortion of the substrate is likely to occur. In contrast, in the SOI substrate SB in which a part of the insulating layer BOX is replaced by the polycrystalline silicon layer PS, film stress is mitigated by the insulating layer BOX, thereby leading to little distortion, so that internal stress becomes small. Hence, exposure accuracy described later is improved. Also, an influence of the internal stress on an element can be mitigated.

Figure 3:
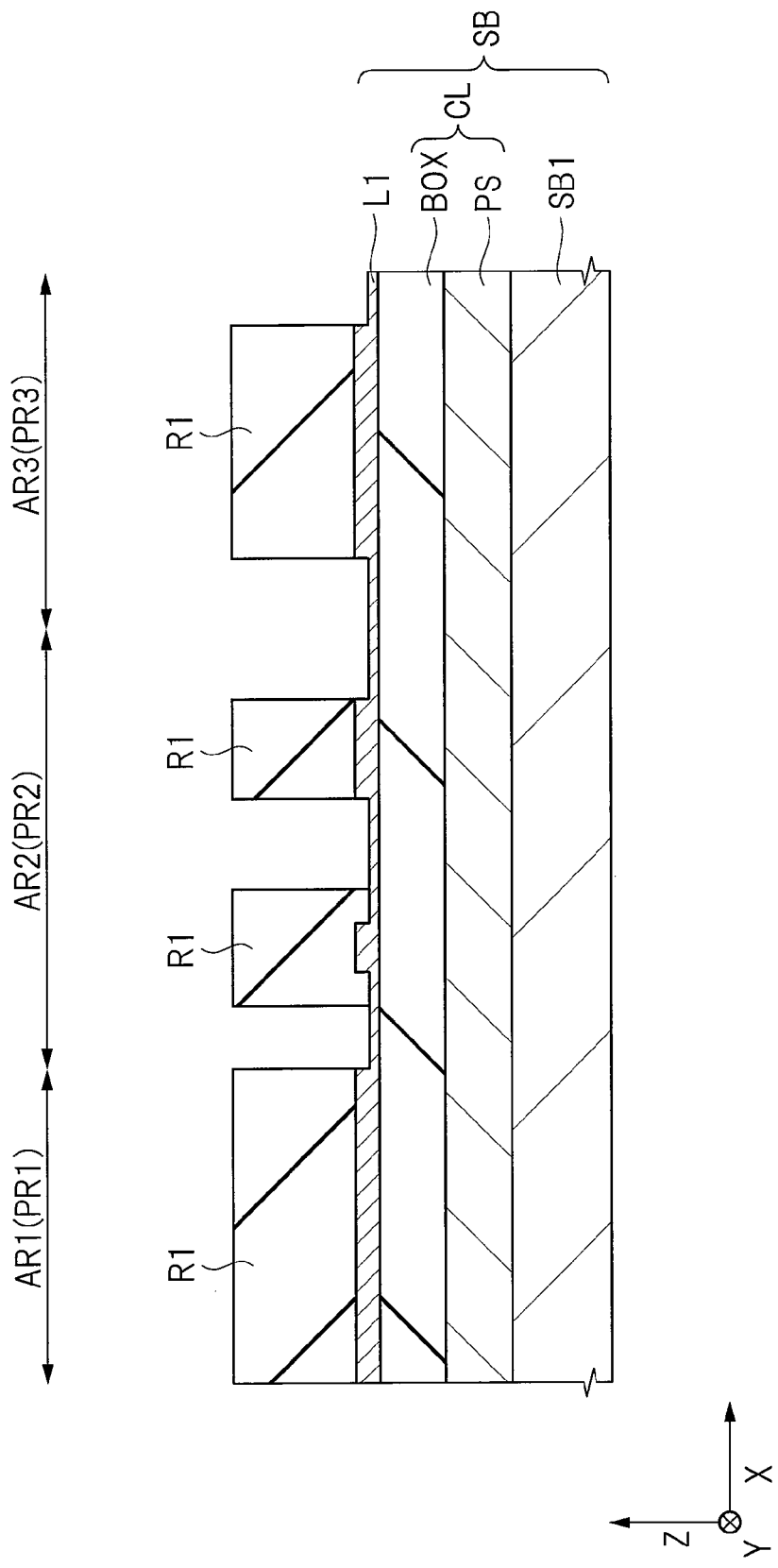
FIG. 3 is a cross-sectional view showing the manufacturing process of the semiconductor device of the first embodiment subsequent to FIG. 2.
Figure 4:
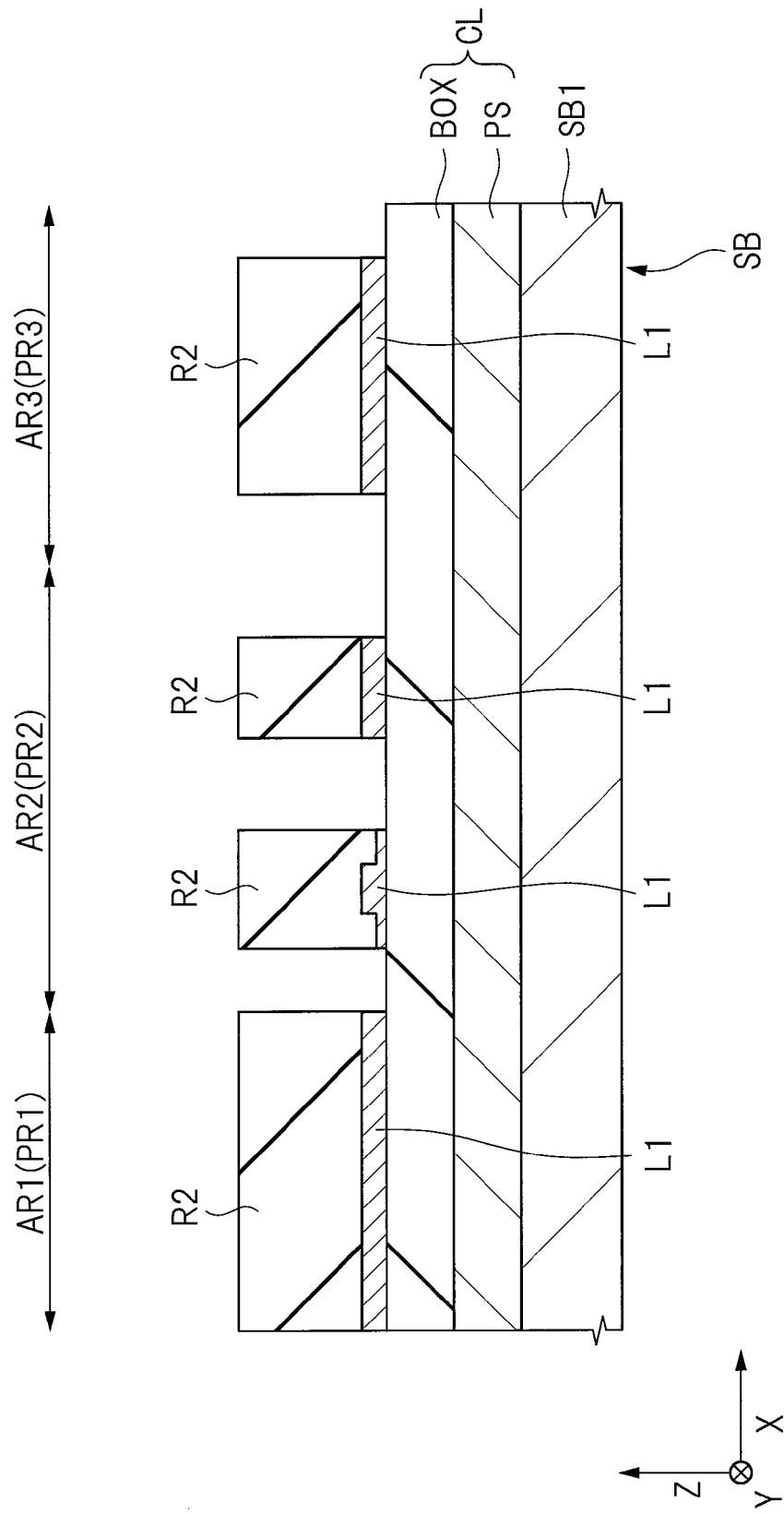
FIG. 4 is a cross-sectional view showing the manufacturing process of the semiconductor device of the first embodiment subsequent to FIG. 3.

Next, as shown in FIG. 3, thick film portions (semiconductor layer L1) constituting optical waveguides WO1, WO2, and WO3, a p-type semiconductor portion PRS, an n-type semiconductor portion NRS, and a p-type semiconductor portion PRO, respectively, are formed. First, a photoresist film. R1 is formed on the entire surface of the SOI substrate SB by coating or the like, and the photoresist film R1 is patterned by photolithography (exposure and development) to remain in the forming regions of the p-type semiconductor portion PRO, the optical waveguides WO1, WO2, and WO3, the p-type semiconductor portion PRS, and the n-type semiconductor portion NRS, respectively. Here, as described above, in the SOI substrate SB in which a part of the insulating layer BOX is replaced by the polycrystalline silicon layer PS, film stress is mitigated by the insulating layer BOX, thereby leading to little distortion, so that patterning accuracy of the photoresist film R1 can be improved. The same goes for the subsequent photoresist films R2 to R4 as well.

Next, after the photoresist film R1 is removed by ashing or the like, the semiconductor layer L1 constituting the optical waveguides WO1 and WO2, the p-type semiconductor portion PR, the n-type semiconductor portion NR, the optical waveguide WO3, the p-type semiconductor portion PRS, the n-type semiconductor portion NRS, and the p-type semiconductor portion PRO, respectively, is formed. First, a photoresist film R2 is formed on the entire surface of the SOI substrate SB by coating or the like, and the photoresist film R2 is patterned by photolithography (exposure and development) to remain in the forming regions of the optical waveguides WO1 and WO2, the p-type semiconductor portion PR, the n-type semiconductor portion NR, the optical waveguide WO3, the p-type semiconductor portion PRS, the n-type semiconductor portion NRS, and the p-type semiconductor portion PRO, respectively. Next, by using the photoresist film R2 as a mask, the semiconductor layer L1 is subjected to dry etching until the surface of the insulating layer BOX is exposed.

According to the above processes, the semiconductor layer L1 constituting the optical waveguides WO1 and WO2, the p-type semiconductor portion PR, the n-type semiconductor portion NR, the optical waveguide WO3, the p-type semiconductor portion PRS, the n-type semiconductor portion NRS, and the p-type semiconductor portion PRO, respectively, can be formed. Note that, at this point, the semiconductor layer L1 still remains intrinsic (i type).

Figure 5:
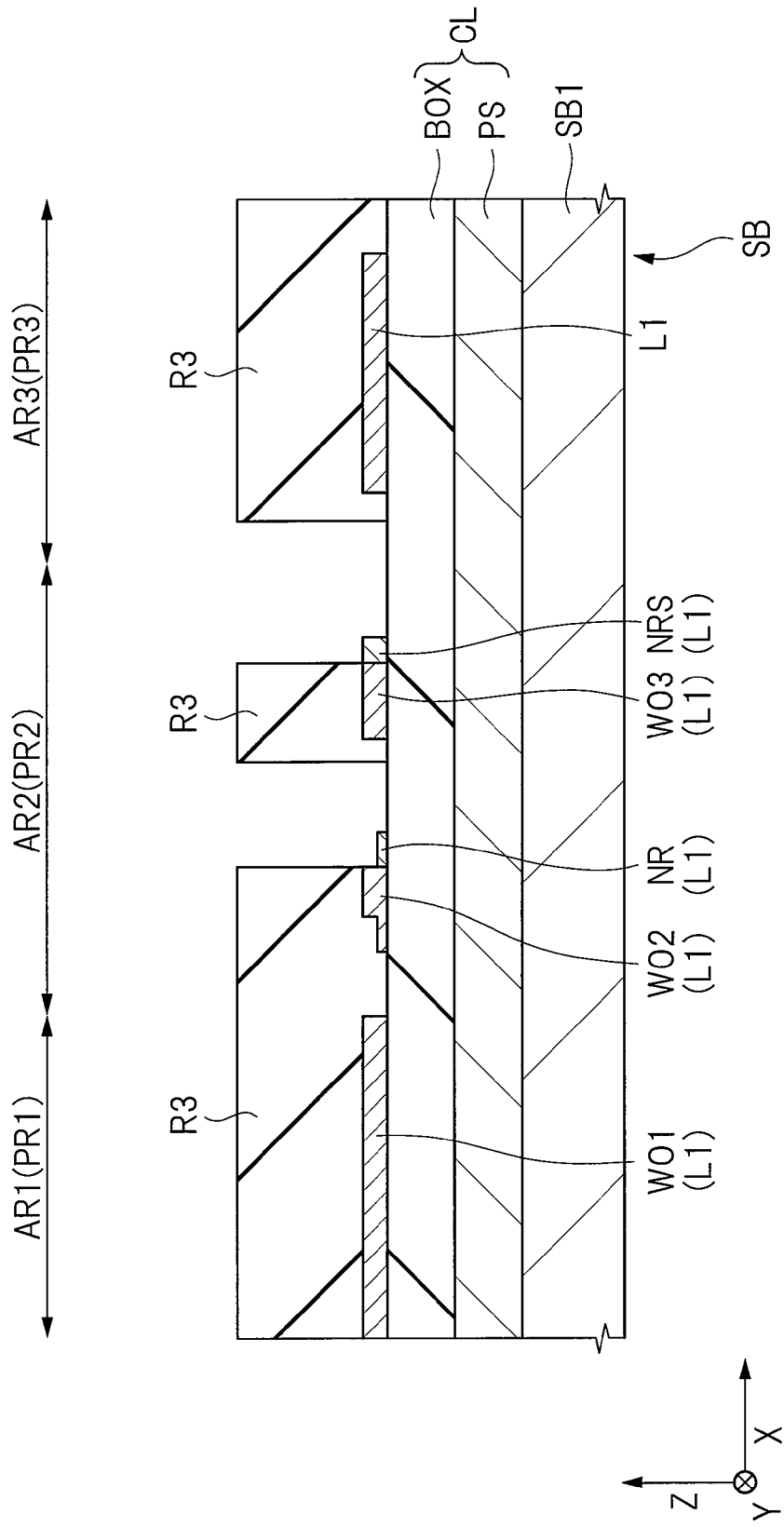
FIG. 5 is a cross-sectional view showing the manufacturing process of the semiconductor device of the first embodiment subsequent to FIG. 4.
Figure 6:
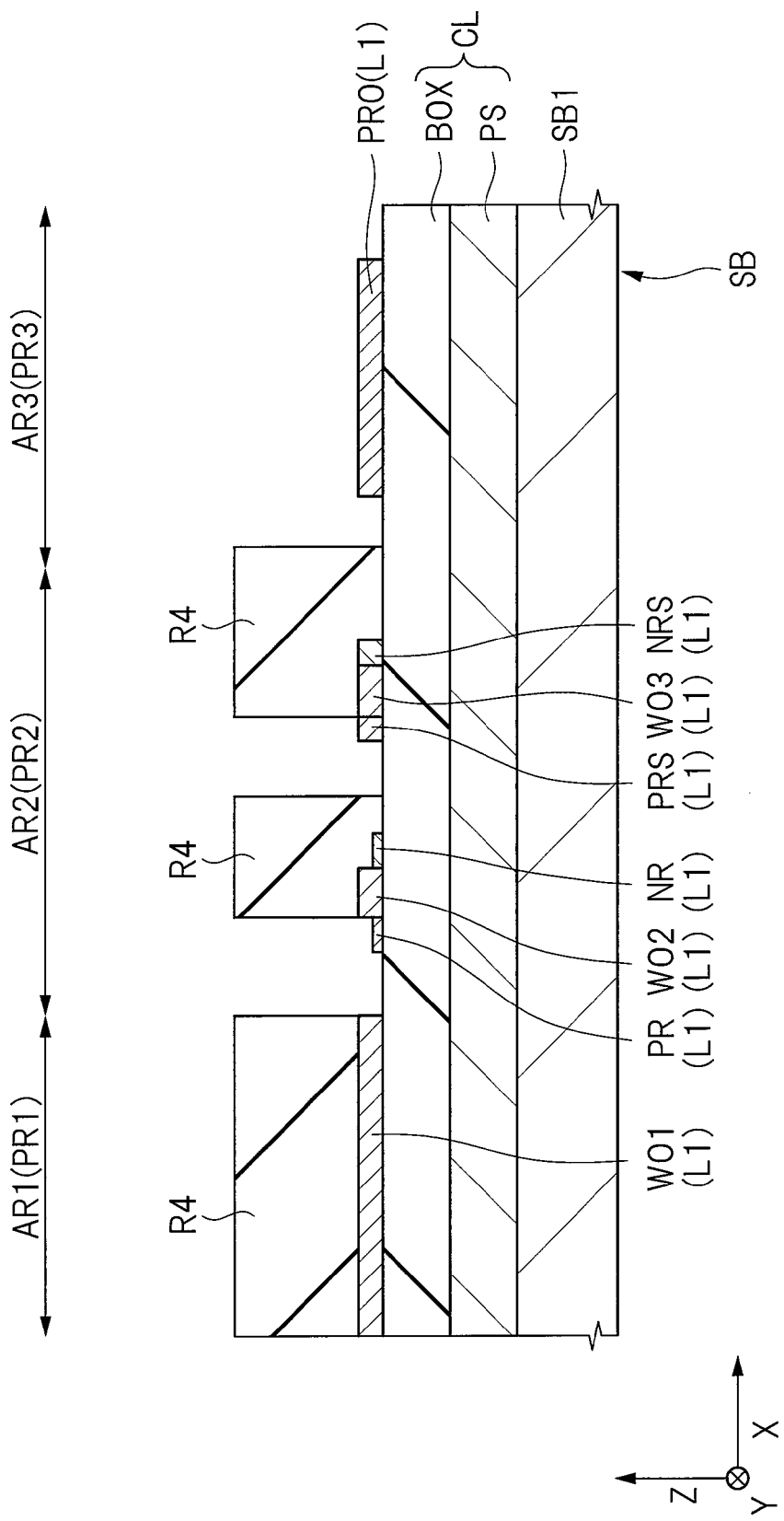
FIG. 6 is a cross-sectional view showing the manufacturing process of the semiconductor device of the first embodiment subsequent to FIG. 5.

Next, as shown in FIGS. 5 and 6, impurity ions are implanted into the semiconductor layer L1 on both sides of the optical waveguide WO2 to form the p-type semiconductor portion PR and the n-type semiconductor portion NR. In addition, impurity ions are implanted into the semiconductor layer L1 on both sides of the optical waveguide WO3 to form the p-type semiconductor portion PRS and the n-type semiconductor portion NRS. Moreover, impurity ions are implanted into the region AR3 to form the p-type semiconductor portion PRO.

First, as shown in FIG. 5, a photoresist film R3 having openings on the semiconductor layer L1 on one side of the optical waveguide WO2 (a right side in FIG. 5, for example) and on the semiconductor layer L1 on one side of the optical waveguide WO3, respectively, is formed by photolithography (exposure and development). Next, by using the photoresist film R3 as a mask, n-type impurity ions are implanted. Accordingly, the n-type semiconductor portions NR and NRS are formed.

Next, after the photoresist film R3 is removed by ashing or the like, a photoresist film R4 having openings on the semiconductor layer L1 on the other side of the optical waveguide WO2 (a left side in FIG. 6, for example), on the semiconductor layer L1 on the other side of the optical waveguide WO3, and on the semiconductor layer L1 in the photoelectric conversion section AR3, respectively, is formed by photolithography (exposure and development), as shown in FIG. 6. Next, by using the photoresist film R4 as a mask, p-type impurity ions are implanted. Accordingly, the p-type semiconductor portion PR, the p-type semiconductor portion PRS, and the p-type semiconductor portion PRO are formed.

Note that, after the p-type and n-type impurities are doped, a heat treatment may be performed to activate the doped impurity ions.

Figure 7:
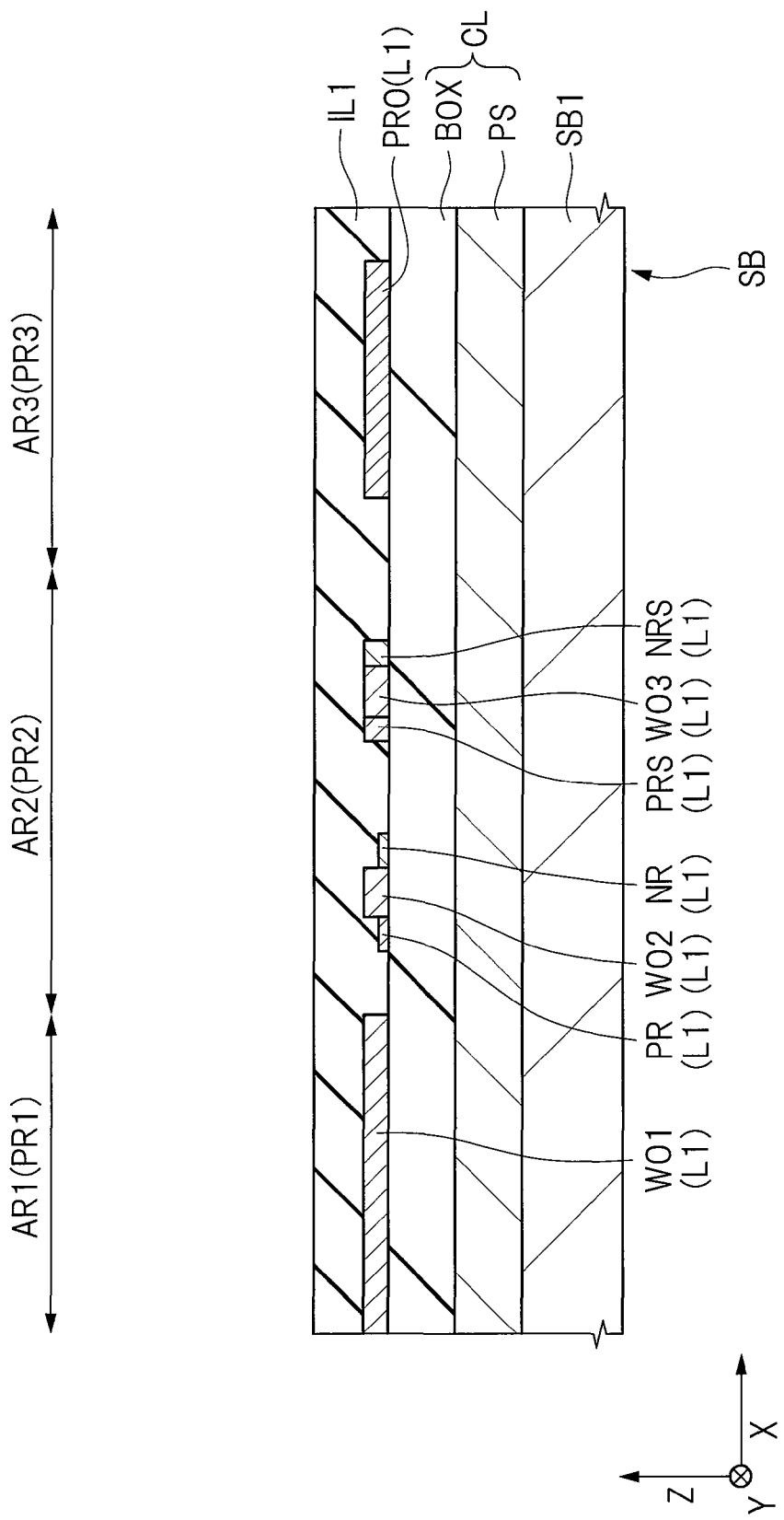
FIG. 7 is a cross-sectional view showing the manufacturing process of the semiconductor device of the first embodiment subsequent to FIG. 6.

Next, as shown in FIG. 7, an interlayer dielectric film IL1 is formed on the optical waveguides WO1, WO2, and WO3, the p-type semiconductor portion PRO, and the like. For example, a silicon oxide film is formed on the optical waveguides WO1, WO2, and WO3, the p-type semiconductor portion PRO, and the like, by the CVD. Next, if necessary, the upper surface of the interlayer dielectric film IL1 is planarized. For example, planarization is performed by polishing the upper surface part of the interlayer dielectric film IL1 by using the CMP (Chemical Mechanical Polishing) or the like.

Figure 8:
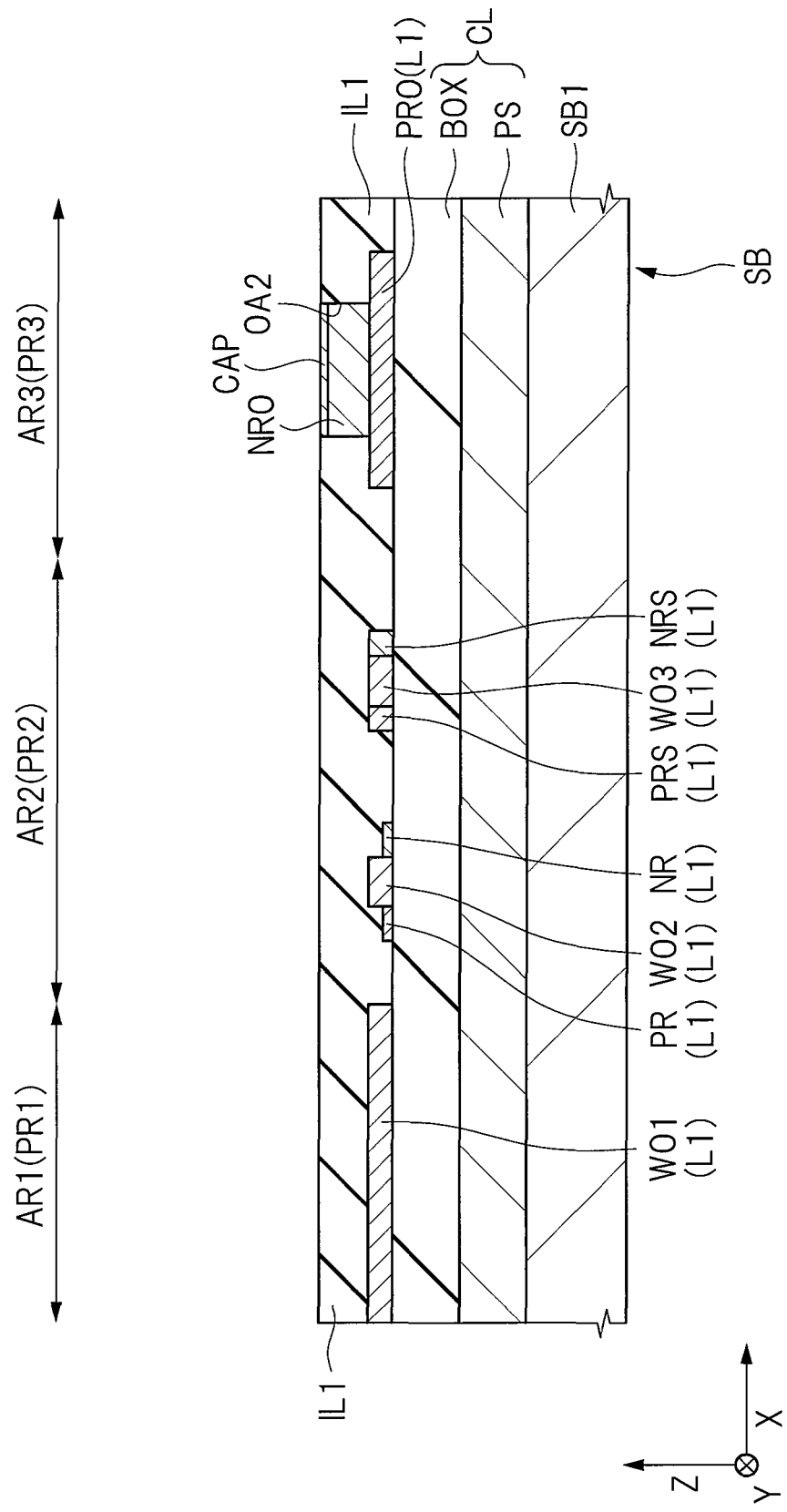
FIG. 8 is a cross-sectional view showing the manufacturing process of the semiconductor device of the first embodiment subsequent to FIG. 7.

Next, as shown in FIG. 8, an n-type semiconductor portion NRO and a cap layer CAP are formed on the p-type semiconductor portion PRO.

First, by removing the interlayer dielectric film IL1 on the p-type semiconductor portion PRO through use of photolithography and etching techniques, an opening portion OA2 is formed on the p-type semiconductor portion PRO. The p-type semiconductor portion PRO made of silicon is exposed on the bottom part of the opening portion OA2. Next, the n-type semiconductor portion NRO made of Ge is formed on the exposed surface of the p-type semiconductor portion PRO. A semiconductor layer made of Ge is epitaxially grown on the p-type semiconductor portion PRO, while doped with the n-type impurities. Note that, after the intrinsic semiconductor layer made of Ge is epitaxially grown, the n-type impurities may be doped by using the ion implantation. Accordingly, an element with a pn junction structure composed of the p-type semiconductor portion PRO and the n-type semiconductor portion NRO made of Ge is formed.

Next, the cap layer CAP is formed on the n-type semiconductor portion NRO. As described above, the cap layer CAP is formed to correct the surface roughness of Ge constituting the n-type semiconductor portion NRO or supplement the film thickness. For example, an n-type silicon film is formed on the n-type semiconductor portion NRO as the cap layer CAP. For example, after a semiconductor film made of silicon is epitaxially grown on the n-type semiconductor portion NRO, the semiconductor film is doped with the n-type impurities by using the ion implantation to form the cap layer CAP.

Figure 9:
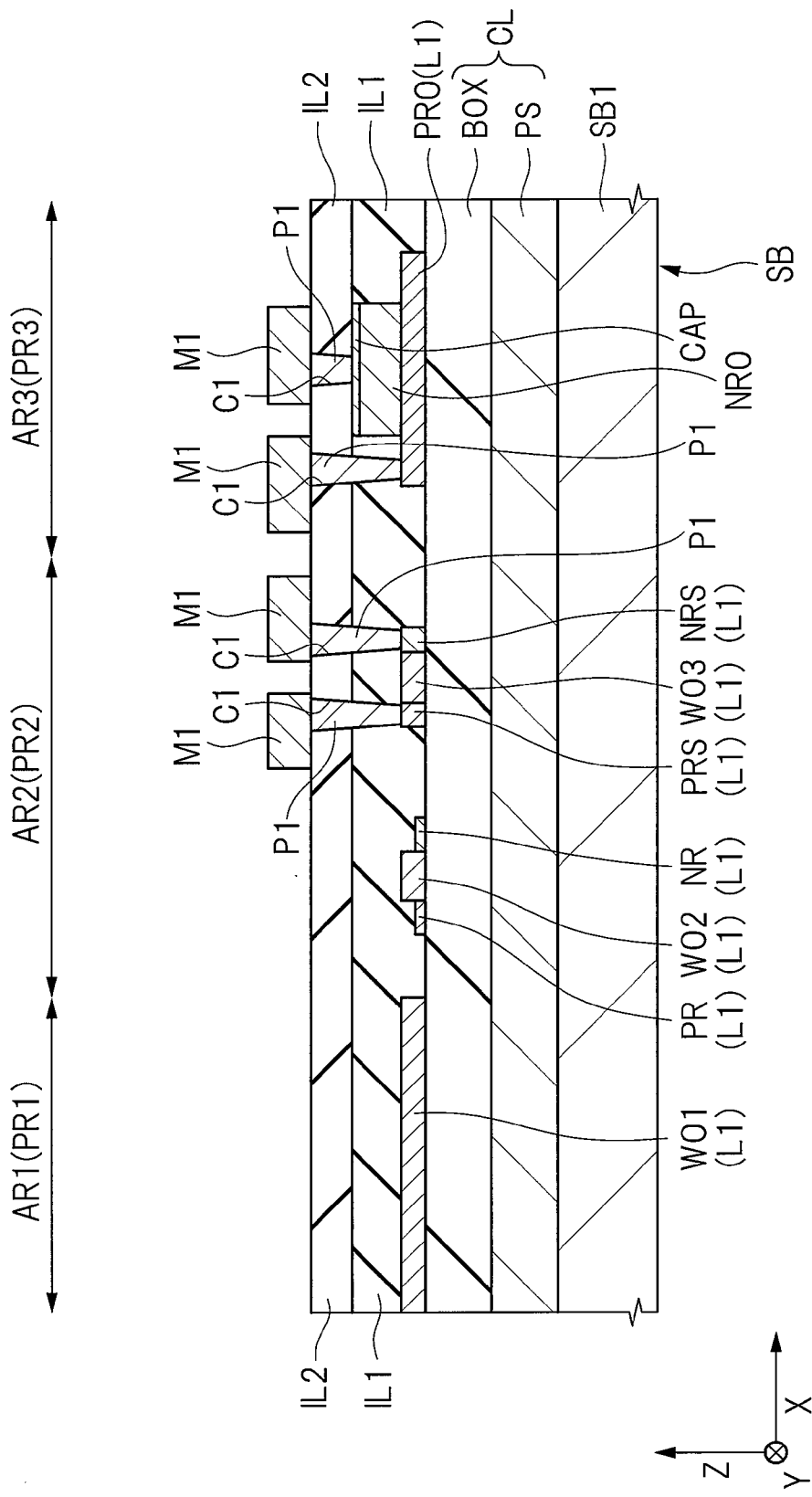
FIG. 9 is a cross-sectional view showing the manufacturing process of the semiconductor device of the first embodiment subsequent to FIG. 8.

Next, as shown in FIG. 9, an interlayer dielectric film IL2, plugs P1, and wires M1 are formed. First, the interlayer dielectric film IL2 is formed on the interlayer dielectric film IL1 and the cap layer CAP. For example, a silicon oxide film is formed on the interlayer dielectric film IL1 and the cap layer CAP as the interlayer dielectric film IL2 by using the CVD. Accordingly, in the regions AR1, AR2, and AR3, the optical waveguides WO1 and WO2, the p-type semiconductor portion PR, the n-type semiconductor portion NR, the optical waveguide WO3, the p-type semiconductor portion PRS, the n-type semiconductor portion NRS, the p-type semiconductor portion PRO, and the n-type semiconductor portion NRO are surrounded by the interlayer dielectric films IL1 and IL2, the insulating layer BOX, and the polycrystalline silicon layer PS.

Next, by removing the interlayer dielectric films IL1 and IL2 on the p-type semiconductor portion PRS, the n-type semiconductor portion NRS, the p-type semiconductor portion PRO, and the cap layer CAP through use of photolithography and etching techniques, contact holes C1 are formed thereon, respectively. Note that, though not shown in FIG. 9, contact holes may be formed also on the p-type semiconductor portion PR and the n-type semiconductor portion NR.

Next, plugs P1 are formed by embedding a conductive film in the contact holes C1. For example, a tungsten film is formed on the interlayer dielectric film IL2 including the inside of the contact holes C1 by sputtering. Next, by removing the tungsten film on the interlayer dielectric film IL2 by the CMP or the like, the tungsten film can be embedded in the contact holes C1.

Next, by forming a conductive film on the plugs P1 and patterning the film, wires M1 are formed. For example, an aluminium-copper alloy film is formed on the plugs P1 and the interlayer dielectric film IL2 by sputtering. By patterning the aluminium-copper alloy film, the wires M1 can be formed. Note that, here, though the wires M1 are formed by patterning, the wires M1 may be formed by the so-called "damascene method." In this case, an insulating film including opening portions (wiring trenches) on the plugs P1 is formed, and a conductive film is embedded in the opening portions, thereby forming the wires M1.

Figure 10:
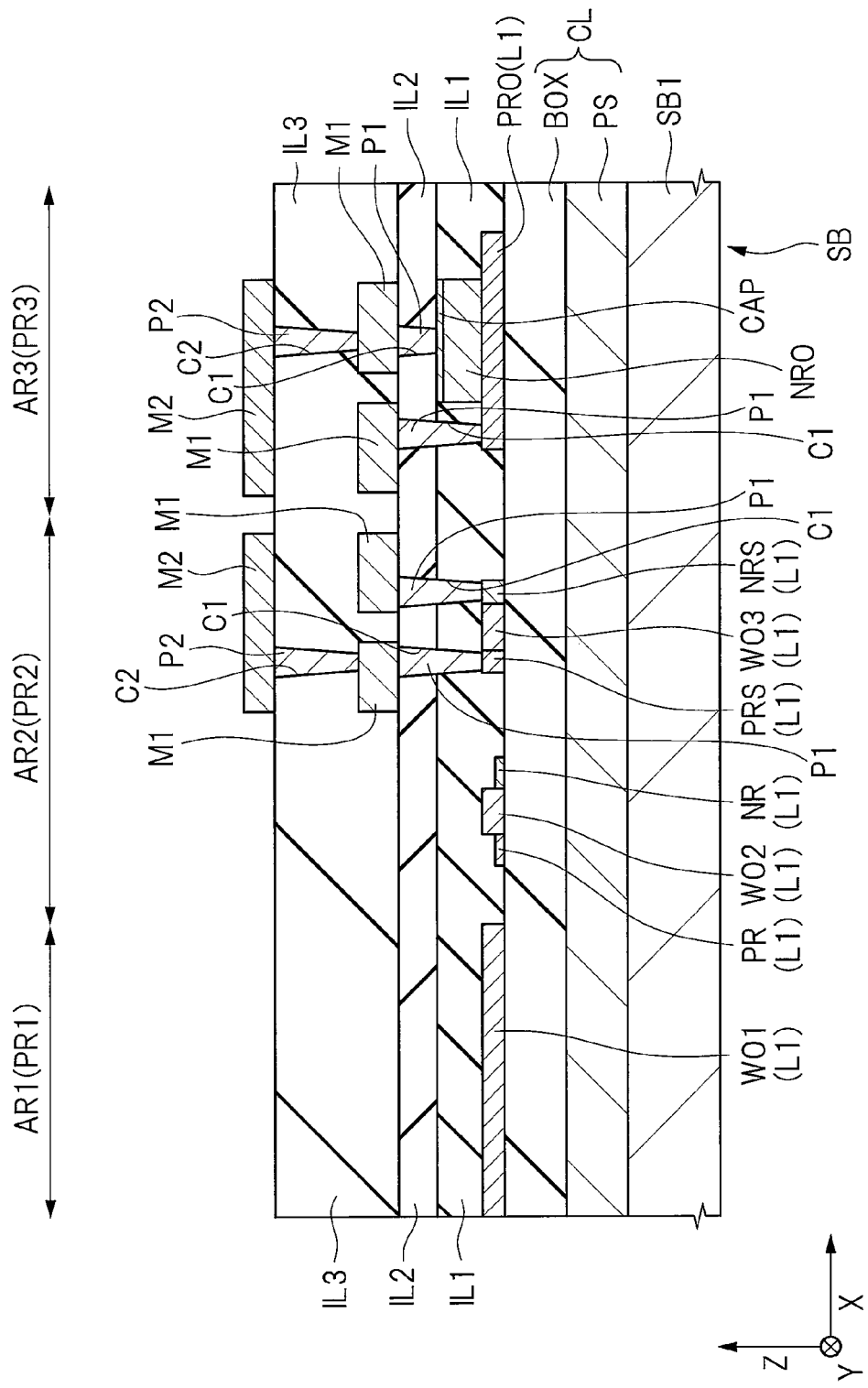
FIG. 10 is a cross-sectional view showing the manufacturing process of the semiconductor device of the first embodiment subsequent to FIG. 9.

Next, as shown in FIG. 10, an interlayer dielectric film IL3, plugs P2, and wires M2 are formed. First, the interlayer dielectric film IL3 is formed on the interlayer dielectric film IL2 and the wires M1. For example, a silicon oxide film is formed on the interlayer dielectric film IL2 and the wires M1 as the interlayer dielectric film IL3 by the CVD. Next, by removing the interlayer dielectric film IL3 on the wires M1 through use of photolithography and etching techniques, contact holes C2 are formed on the wires M1. Next, the plugs P2 are formed by embedding a conductive film in the contact holes C2. For example, the plugs P2 can be formed in the same manner as in the case of the plugs P1. Next, the wires M2 are formed on the plugs P2. For example, the wires M2 can be formed in the same manner as in the case of the wires M1. The wires M2 may be formed by the so-called "damascene method." In this case, the plugs P2 and the wires M2 may be formed at the same time by the "dual damascene method" in which the contact holes and the wiring trenches are embedded at the same time.

Thereafter, a protective film TC is formed on the wires M2, and pad portions are further formed on the wires M2. For example, first, a silicon oxynitride film is formed on the interlayer dielectric film IL3 and the wires M2 as the protective film TC by using the CVD. Next, by removing the protective film TC on the wires M2 through use of photolithography and etching techniques, the surfaces of the wires M2 are exposed. The exposed regions of the wires M2 serve as the pad portions (external connection regions) (see, opening portions OA1) (FIG. 1). Note that, though the configuration in which two layers of wires (M1 and M2) are disposed under the protective film TC is described herein byway of example, a large number of layers of wires may additionally be formed.

Also, after forming the protective film TC, the SOI substrate SB in a wafer state is cut out for each chip region having an approximately rectangular shape.

Figure 11:
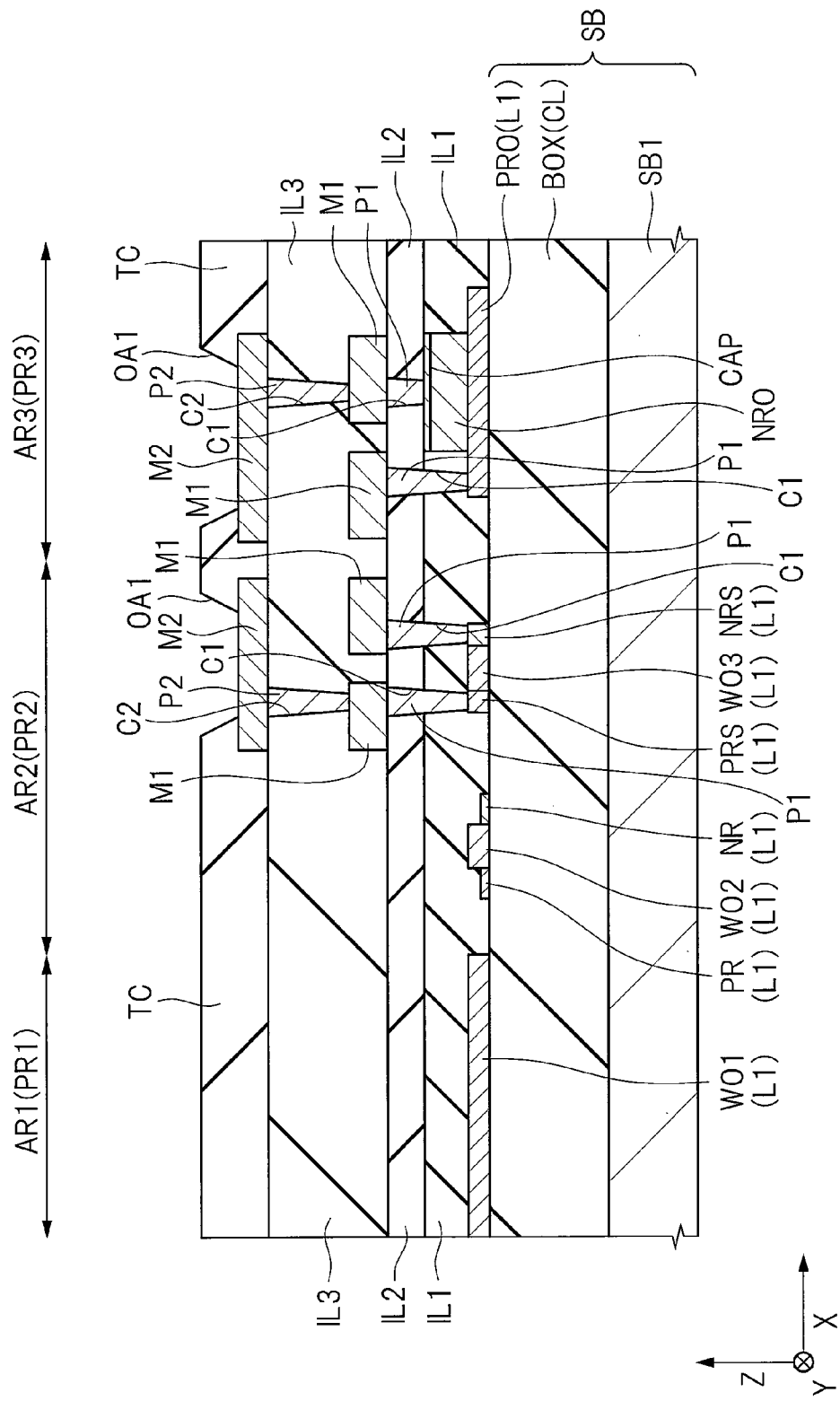
FIG. 11 is a cross-sectional view showing a configuration of a semiconductor device of a comparative example.

FIG. 11 is a cross-sectional view showing a configuration of a semiconductor device of a comparative example. Like FIG. 11, when the thickness of the insulating layer BOX is increased to be 2 to 3 µm, the film stress increases, so that distortion of the substrate is likely to occur. In contrast, in the SOI substrate SB in which a part of the insulating layer BOX is replaced by the polycrystalline silicon layer PS, the film stress is mitigated by the insulating layer BOX, thereby leading to little distortion. Hence, in the photolithography (exposure and development) process described above, exposure accuracy is improved. Also, an influence of the internal stress on an element can be mitigated, so that degradation in characteristic and destruction due to the internal stress of a variety of elements such as the diode with a pin structure and the element with a pn junction structure described above can be suppressed.

Meanwhile, with respect to leakage of light in the case of decreasing the thickness of the insulating layer BOX, reflection (diffusion) of light is suppressed by arranging the polycrystalline silicon layer PS under the insulating layer BOX, so that an adverse effect due to leakage of light can be avoided. For example, diffusion and interference of optical signals are suppressed, so that transmission characteristics of the optical signals can be maintained.
(Method of Manufacturing an SOI Substrate)

A method of forming the SOI substrate SB shown in FIG. 2 is not limited, and the SOI substrate SB is formed in the manner described below, for example.

First Example

FIGS. 12A to 12C, 13A, and 13B are cross-sectional views showing a first example of the method of manufacturing the SOI substrate of the present embodiment.

Figure 12A:
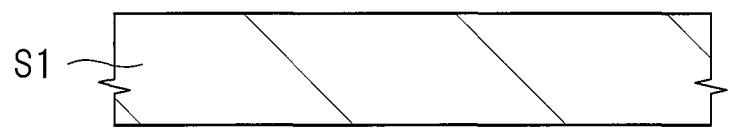
FIG. 12A is a cross-sectional view showing a first example of a method of manufacturing an SOI substrate of the first embodiment.
Figure 12B:
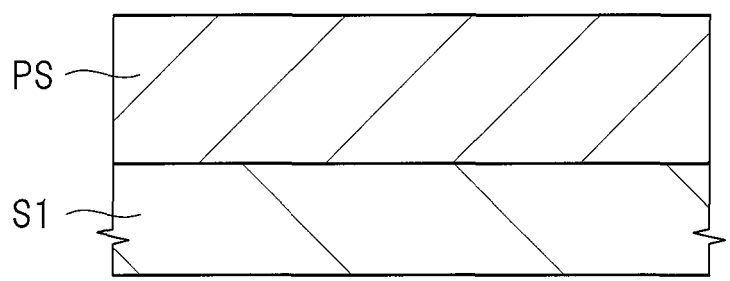
FIG. 12B is a cross-sectional view showing the first example of the method of manufacturing the SOI substrate of the first embodiment.
Figure 12C:
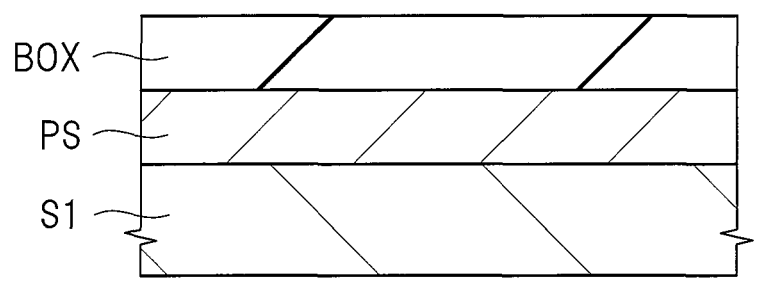
FIG. 12C is a cross-sectional view showing the first example of the method of manufacturing the SOI substrate of the first embodiment.

A first silicon substrate S1 shown in FIG. 12A is prepared, and a polycrystalline silicon layer PS is formed on the upper surface thereof by using the CVD or the like (FIG. 12B). The film thickness of the polycrystalline silicon layer PS is approximately 2 µm, for example. Next, as shown in FIG. 12C, the upper surface of the polycrystalline silicon layer PS is oxidized to form an insulating layer BOX composed of a silicon oxide film. The film thickness of the insulating layer BOX is approximately 1 µm, for example. Note that, since volume expansion is caused by oxidizing silicon, the film thickness of the polycrystalline silicon layer PS before oxidizing may be adjusted in consideration of the volume expansion such that the film thickness of the insulating layer BOX is set to be approximately 1 µm and that of the polycrystalline silicon layer PS which remains thereunder is set to be approximately 1 µm.

Figure 13A:
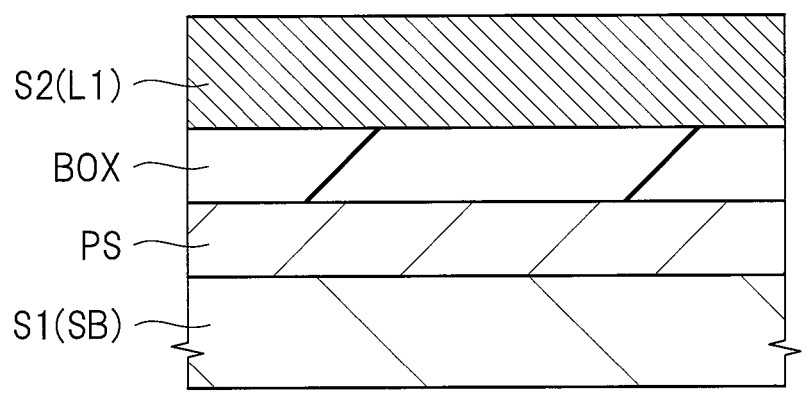
FIG. 13A is a cross-sectional view showing the first example of the method of manufacturing the SOI substrate of the first embodiment.
Figure 13B:
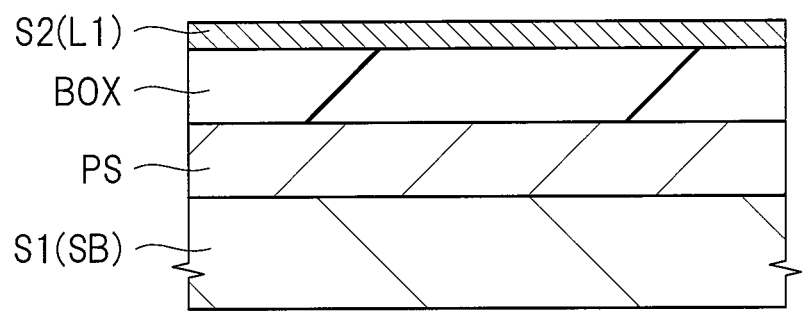
FIG. 13B is a cross-sectional view showing the first example of the method of manufacturing the SOI substrate of the first embodiment.

Next, as shown in FIG. 13A, a second silicon substrate S2 is pressure-bonded to the upper surface side of the first silicon substrate S1 via the polycrystalline silicon layer PS and the insulating layer BOX under high temperature. Thereafter, as shown in FIG. 13B, the second silicon substrate S2 is set to be the upper surface of the SOI substrate SB and made thin by using the CMP or the like. In this case, a thin film which is the second silicon substrate S2 remains on the insulating layer BOX. This thin film serves as the semiconductor layer L1. The thickness of the thin film (L1) which is the second silicon substrate S2 is set to be approximately 300 nm, for example.

Thus, the SOI substrate SB composed of a laminated layer of the semiconductor layer L1, the insulating layer BOX, the polycrystalline silicon layer PS, and the first silicon substrate S1 can be formed.

Second Example

Although the upper surface of the polycrystalline silicon layer PS is oxidized to form the insulating layer BOX composed of a silicon oxide film in the first example described above, the insulating layer BOX composed of a silicon oxide film may be formed on the side of the second silicon substrate S2. FIGS. 14A to 14C, 15A, and 15B are cross-sectional views showing a second example of the method of manufacturing the SOI substrate of the present embodiment.

Figure 14A:
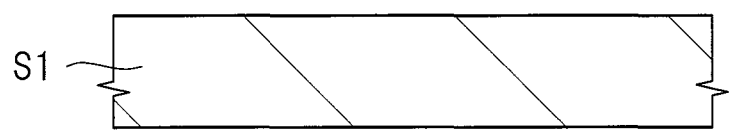
FIG. 14A is a cross-sectional view showing a second example of a method of manufacturing an SOI substrate of the first embodiment.
Figure 14B:
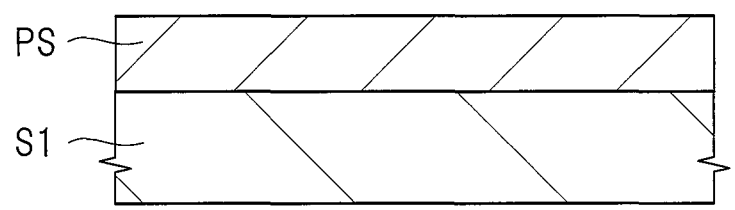
FIG. 14B is a cross-sectional view showing the second example of the method of manufacturing the SOI substrate of the first embodiment.
Figure 14C:
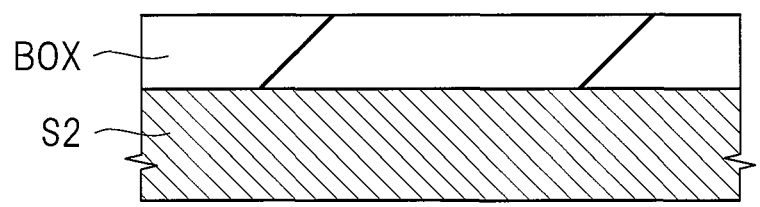
FIG. 14C is a cross-sectional view showing the second example of the method of manufacturing the SOI substrate of the first embodiment.

A first silicon substrate S1 shown in FIG. 14A is prepared, and a polycrystalline silicon layer PS is formed on the upper surface thereof by using the CVD or the like (FIG. 14B). The film thickness of the polycrystalline silicon layer PS is approximately 1 µm, for example. Next, as shown in FIG. 14C, a second silicon substrate S2 is prepared, and the upper surface thereof is oxidized to form an insulating layer BOX composed of a silicon oxide film. The film thickness of the insulating layer BOX is approximately 1 µm, for example.

Figure 15A:
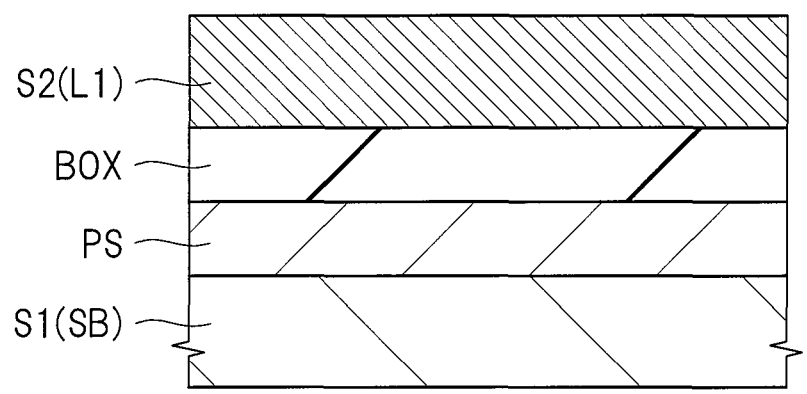
FIG. 15A is a cross-sectional view showing the second example of the method of manufacturing the SOI substrate of the first embodiment.
Figure 15B:
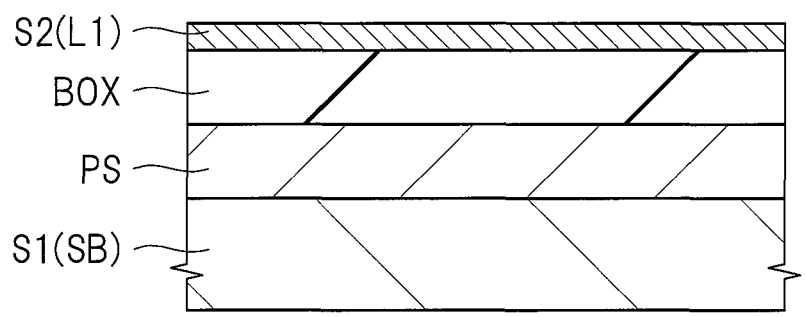
FIG. 15B is a cross-sectional view showing the second example of the method of manufacturing the SOI substrate of the first embodiment.

Next, as shown in FIG. 15A, the polycrystalline silicon layer PS on the upper surface side of the first silicon substrate S1 is pressure-bonded to the insulating layer BOX on the upper surface side of the second silicon substrate S2 under high temperature. Thereafter, as shown in FIG. 15B, the second silicon substrate S2 is set to be the upper surface of the SOI substrate SB and made thin by using the CMP or the like. In this case, a thin film which is the second silicon substrate S2 remains on the insulating layer BOX to serve as the semiconductor layer L1. The thickness of the thin film (L1) which is the second silicon substrate S2 is set to be approximately 300 nm, for example.

Thus, the SOI substrate SB composed of a laminated layer of the semiconductor layer L1, the insulating layer BOX, the polycrystalline silicon layer PS, and the first silicon substrate S1 can be formed.

Second Embodiment

In the present embodiment, various application examples of the configuration of the semiconductor device of the first embodiment will be described.

Application Example 1

Although the polycrystalline silicon layer PS is provided on the entire surface of the base substrate SB1 in the first embodiment (FIG. 1), the polycrystalline silicon layer PS may be partially (selectively) provided on the base substrate SB1.

Figure 16:
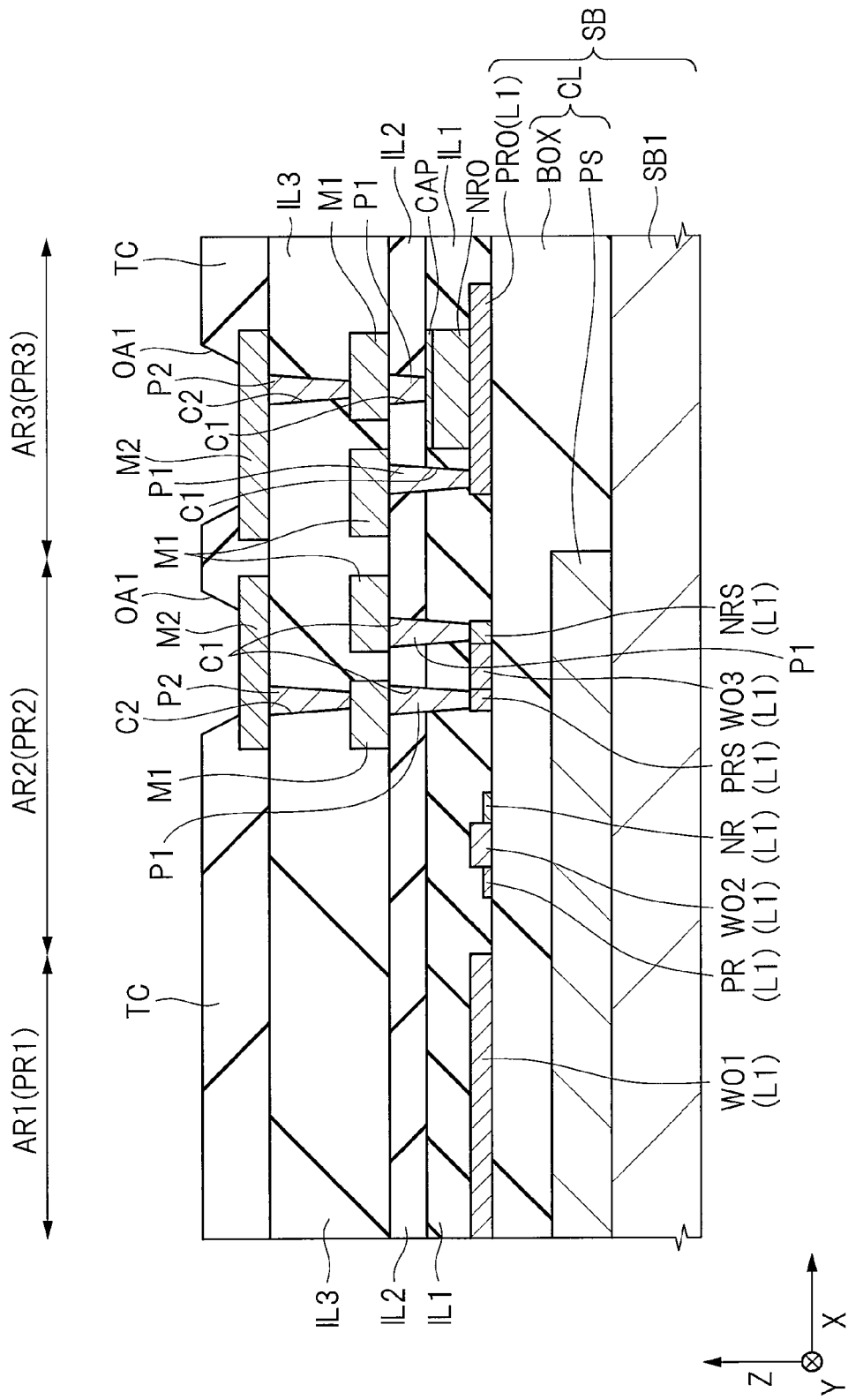
FIG. 16 is a cross-sectional view showing a configuration of a semiconductor device of a first application example of a second embodiment.
Figure 17:
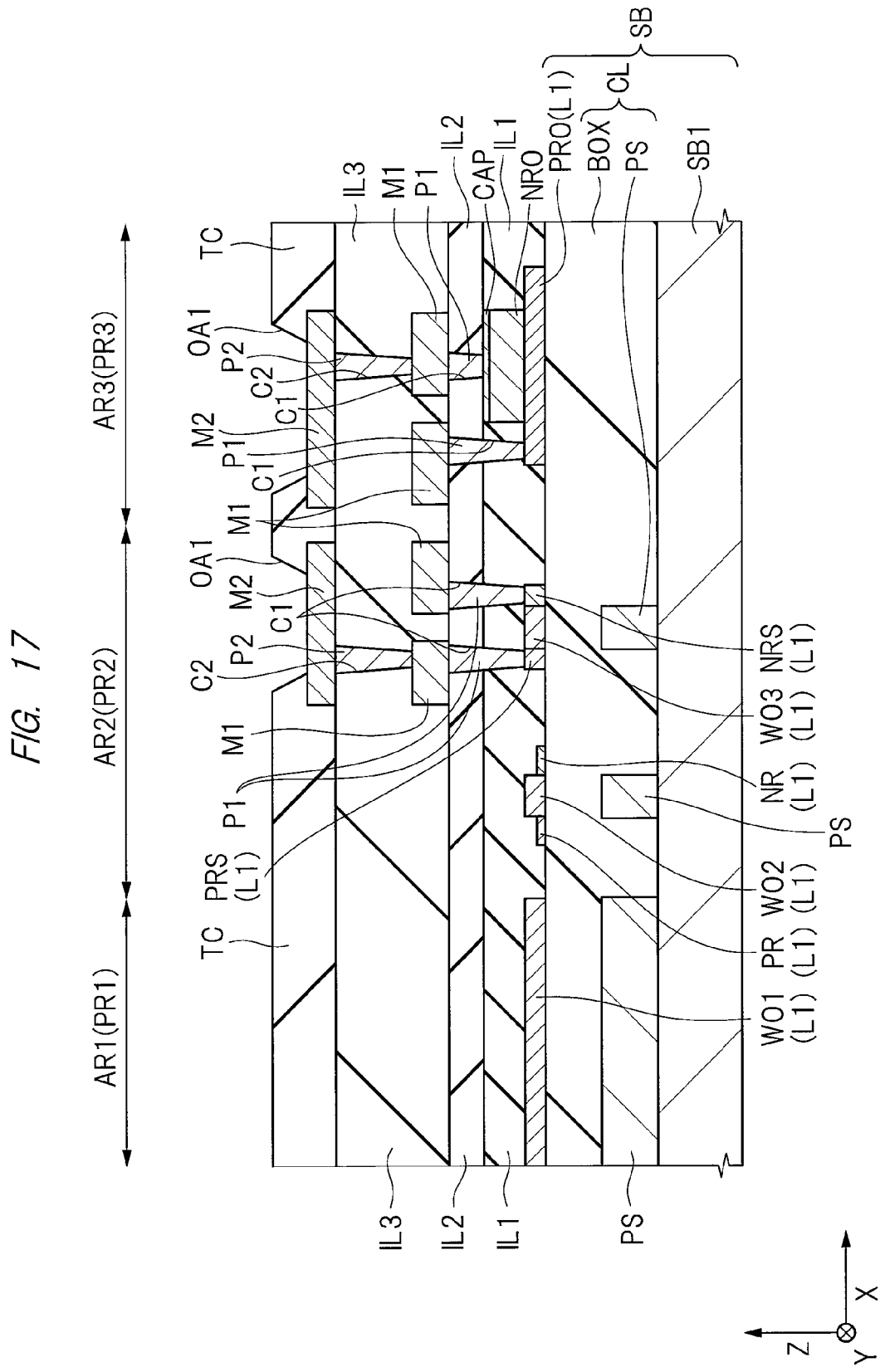
FIG. 17 is a cross-sectional view showing the configuration of the semiconductor device of the first application example of the second embodiment.
Figure 18:
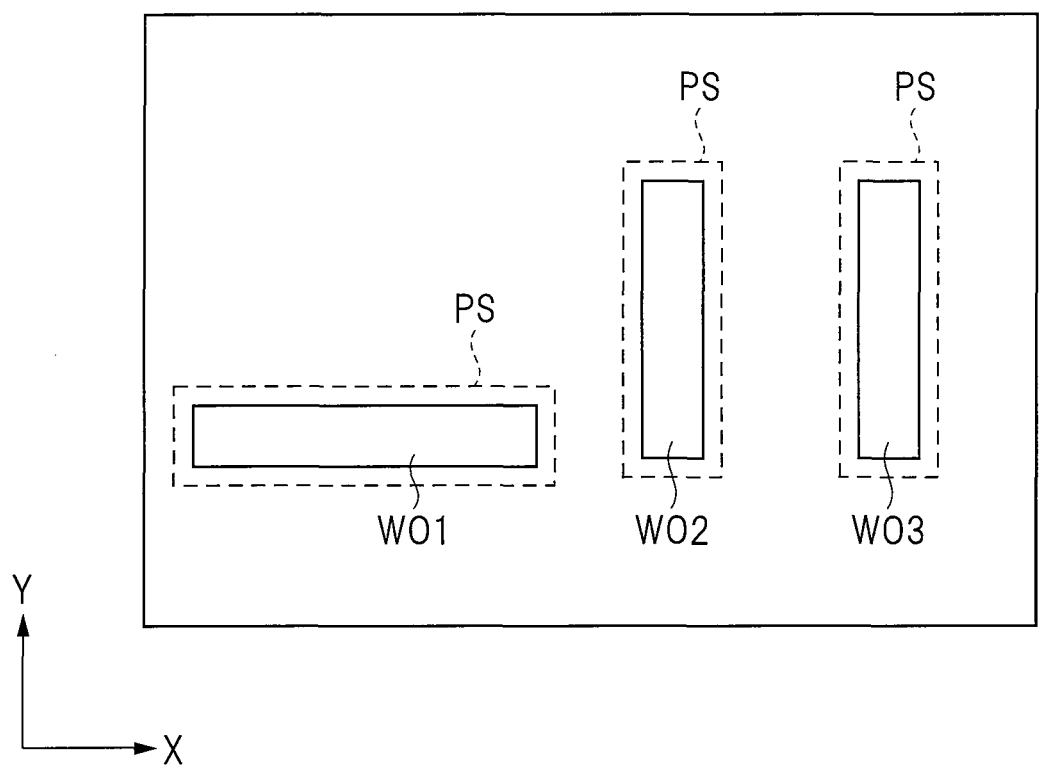
FIG. 18 is a plan view showing the configuration of the semiconductor device of the first application example of the second embodiment.

FIGS. 16 and 17 are cross-sectional views showing a configuration of a semiconductor device of a first application example of the present embodiment. FIG. 18 is a plan view showing the configuration of the semiconductor device of the first application example of the present embodiment.

In the semiconductor device shown in FIG. 16, the polycrystalline silicon layer PS is partially (selectively) provided on the base substrate SB1. Here, the polycrystalline silicon layer PS is provided on the base substrate SB1 in the regions AR1 and AR2, that is, the optical signal transmission line section PR1 in which the optical waveguide WO1 is formed and the optical modulation section PR2 in which the optical waveguides WO2 and WO3 are formed, while the polycrystalline silicon layer PS is not provided on the base substrate SB1 in the region AR3, that is, the photoelectric conversion section PR3 in which an optical waveguide is not formed. Accordingly, the film thickness of the insulating layer BOX in the region AR3, that is, the photoelectric conversion section PR3, becomes larger than that of the insulating layer BOX in the other regions (regions AR1 and AR2).

In the semiconductor device shown in FIG. 17, the polycrystalline silicon layer PS is provided on the base substrate SB1 only directly below each of the optical waveguides WO1, WO2, and WO3. For example, the planar shapes of the polycrystalline silicon layers PS can be set to be approximately the same as those of the optical waveguides WO1, WO2, and WO3, respectively. Also, in this case, the polycrystalline silicon layers PS are arranged directly below the respective optical waveguides (WO2 and WO3), while the polycrystalline silicon layer PS is not arranged directly below the semiconductor portions (PR, NR, PRS, and NRS). In the regions in which the polycrystalline silicon layer PS is not arranged, the insulating layer BOX is formed to be thick.

Also, as shown in FIG. 18, the planar shapes of the polycrystalline silicon layers PS may be set to be slightly larger than the planar shapes of the optical waveguides WO1, WO2, and WO3, respectively.

Thus, by providing the polycrystalline silicon layer PS at required places (specifically, directly below the optical waveguides WO1, WO2, and WO3), reflection (diffusion) of light leaked out beyond the insulating layer BOX can be suppressed like the first embodiment. In addition, by adjusting the forming region of the polycrystalline silicon layer PS, the film stress due to the laminated layer of the polycrystalline silicon layer PS and the insulating layer BOX can be adjusted.

(Method of Manufacturing an SOI Substrate)

A method of forming the SOI substrate SB partially including the polycrystalline silicon layer PS is not limited, and the SOI substrate SB is formed in the manner described below, for example.

FIGS. 19A to 19C, 20A, and 20B are cross-sectional views showing a method of manufacturing an SOI substrate of the present application example.

Figure 19A:
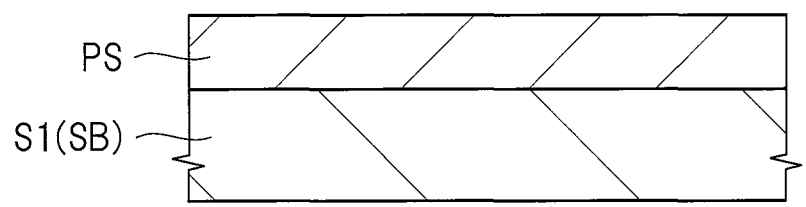
FIG. 19A is a cross-sectional view showing a method of manufacturing an SOI substrate of the first application example.
Figure 19B:
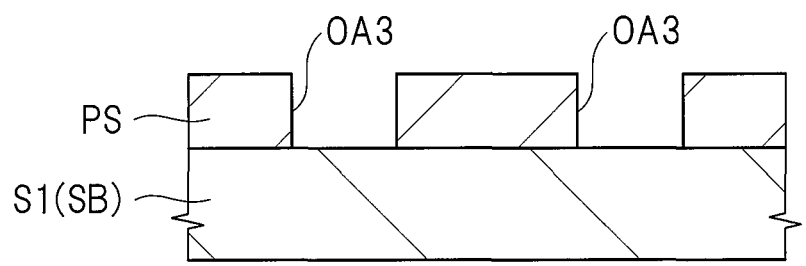
FIG. 19B is a cross-sectional view showing the method of manufacturing the SOI substrate of the first application example.

A first silicon substrate S1 shown in FIG. 19A is prepared, and a polycrystalline silicon layer PS is formed on the upper surface thereof by using the CVD or the like. The film thickness of the polycrystalline silicon layer PS is approximately 1 µm, for example. Next, as shown in FIG. 19B, the polycrystalline silicon layer PS is selectively removed through use of photolithography and etching techniques. The parts in which the polycrystalline silicon layer PS is selectively removed become the opening portions OA3.

Figure 19C:
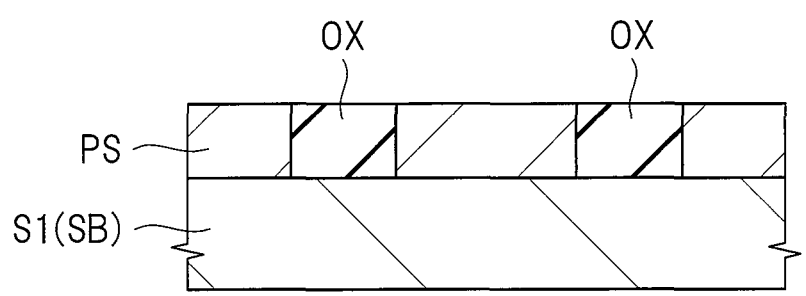
FIG. 19C is a cross-sectional view showing the method of manufacturing the SOI substrate of the first application example.

Next, an insulating film OX is embedded in the opening portions OA3. For example, a silicon oxide film is formed on the polycrystalline silicon layer PS including the inside of the opening portions OA3 by the CVD. Next, by removing the silicon oxide film on the polycrystalline silicon layer PS by the CMP or the like, the insulating film OX can be embedded in the opening portions OA3 (FIG. 19C). Also, a second silicon substrate S2 is prepared, and the upper surface thereof is oxidized to form an insulating layer BOX composed of a silicon oxide film (see FIG. 14C). The film thickness of the insulating layer BOX is approximately 1 µm, for example.

Figure 20A:
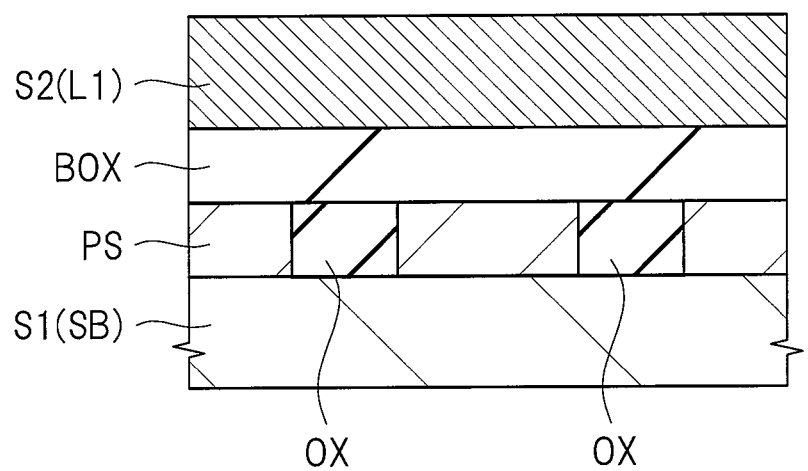
FIG. 20A is a cross-sectional view showing the method of manufacturing the SOI substrate of the first application example.
Figure 20B:
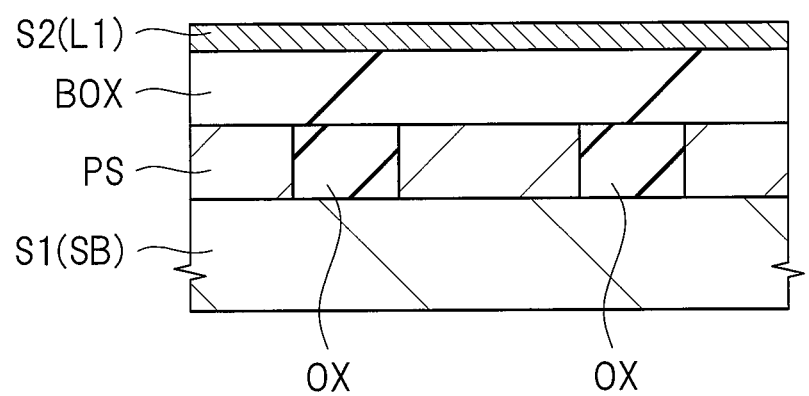
FIG. 20B is a cross-sectional view showing the method of manufacturing the SOI substrate of the first application example.

Next, as shown in FIG. 20A, the polycrystalline silicon layer PS on the upper surface side of the first silicon substrate S1 is pressure-bonded to the insulating layer BOX on the upper surface side of the second silicon substrate S2 under high temperature. Thereafter, as shown in FIG. 20B, the second silicon substrate S2 is arranged to be the upper surface of the SOI substrate SB and made thin by using the CMP or the like. In this case, a thin film which is the second silicon substrate S2 remains on the insulating layer BOX. This thin film serves as the semiconductor layer L1. The thickness of the thin film (L1) which is the second silicon substrate S2 is set to be approximately 300 nm, for example.

Thus, the SOI substrate SB partially including the polycrystalline silicon layer PS can be formed.

Also, since the configurations and manufacturing processes of the optical signal transmission line section PR1, the optical modulation section PR2, and the photoelectric conversion section PR3 formed in the semiconductor layer L1 of the SOI substrate SB are the same as the case in the first embodiment, the description thereof is omitted here.

Second Application Example

Although the polycrystalline silicon layer PS is not provided in the photoelectric conversion section PR3 and the thick insulating layer BOX is arranged in the first application example (FIGS. 16, 17, and the like), a single-crystal silicon film (single-crystal silicon layer) CS having a high reflectance may be formed in the photoelectric conversion section PR3.

Figure 21:
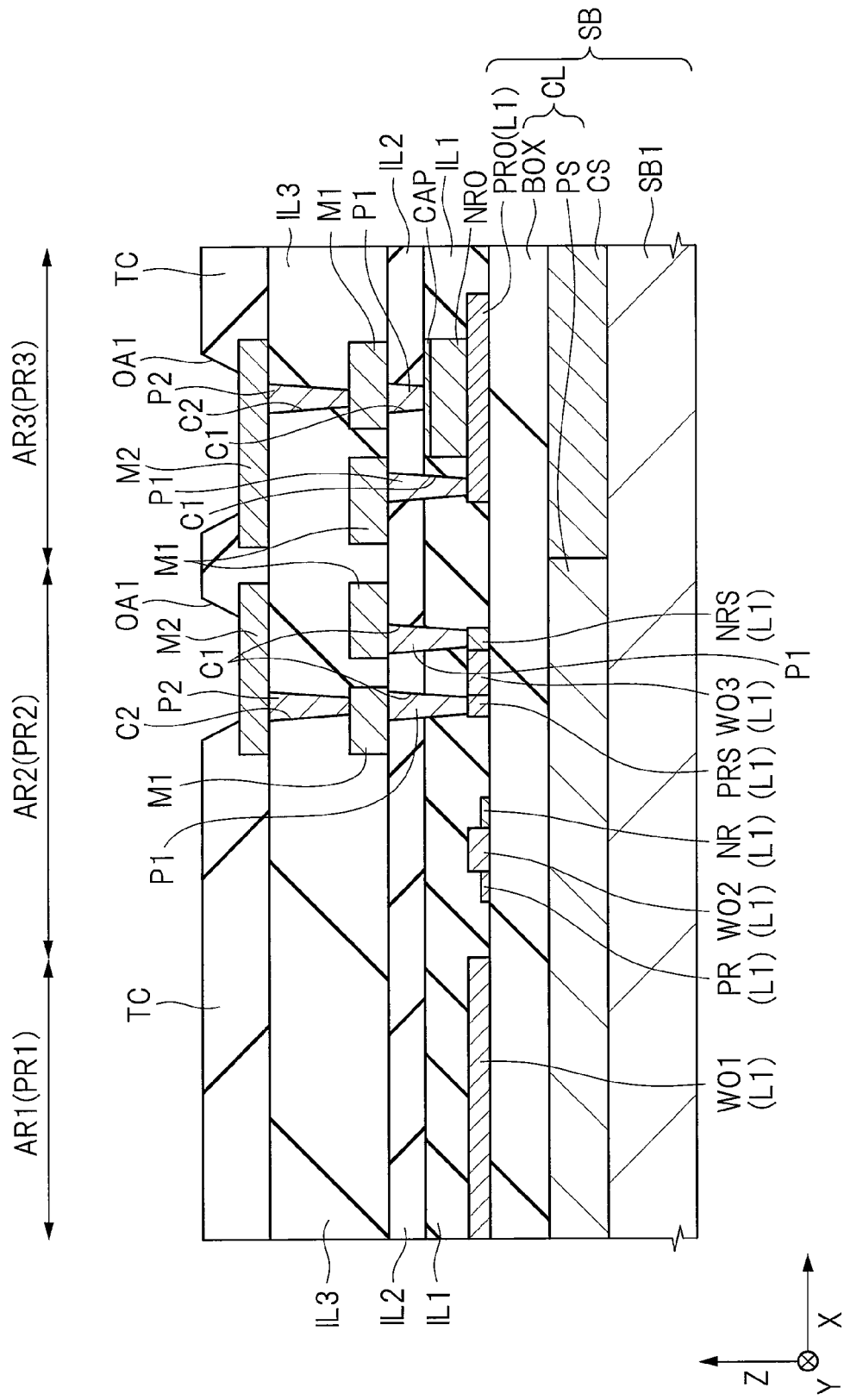
FIG. 21 is a cross-sectional view showing a configuration of a semiconductor device of a second application example of the second embodiment.

FIG. 21 is a cross-sectional view showing a configuration of a semiconductor device of a second application example of the present embodiment.

Although the silicon layer is provided on the entire surface of the base substrate SB1 in the semiconductor device shown in FIG. 21, the region in which the polycrystalline silicon layer PS is provided and the region in which the single-crystal silicon film CS is provided are present.

Here, the polycrystalline silicon layer PS is provided on the base substrate SB1 in the regions AR1 and AR2, that is, in the optical signal transmission line section PR1 in which the optical waveguide WO1 is formed and the optical modulation section PR2 in which the optical waveguides WO2 and WO3 are formed and is not provided on the base substrate SB1 in the regions AR3, that is, in the photoelectric conversion section PR3, but instead, the single-crystal silicon film CS is provided therein. The single-crystal silicon film CS is located in the same layer as the polycrystalline silicon layer PS. In other words, the single-crystal silicon film. CS is located approximately in the same height as the polycrystalline silicon layer PS and has approximately the same film thickness as that of the polycrystalline silicon layer PS.

Thus, by providing the polycrystalline silicon layer PS at required places (specifically, below the optical waveguides WO1, WO2, and WO3), reflection (diffusion) of light leaked out beyond the insulating layer BOX can be suppressed like the second application example. Moreover, by providing the single-crystal silicon film CS having a high reflectance in the photoelectric conversion section PR3, the leaked light leaked out beyond the insulating layer BOX is reflected, and the reflected light enters the photoelectric conversion section PR3 again. As a result, photoelectric conversion efficiency can be improved. That is, the single-crystal silicon film CS can serve as a reflection film.

Specifically, when light enters the element with a pn junction structure from the upward direction of the SOI substrate SB, the reflected light can efficiently be utilized, so that photoelectric conversion efficiency can be improved.

(Method of Manufacturing an SOI Substrate)

A method of forming the SOI substrate SB including the polycrystalline silicon layer PS and the single-crystal silicon film CS is not limited, and the SOI substrate SB is formed in the manner described below, for example.

FIGS. 22A to 22C, 23A, and 23B are cross-sectional views showing a method of manufacturing an SOI substrate of the present application example.

Figure 22A:
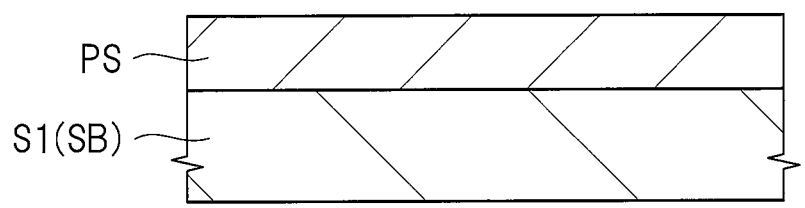
FIG. 22A is a cross-sectional view showing a method of manufacturing an SOI substrate of the second application example.
Figure 22B:
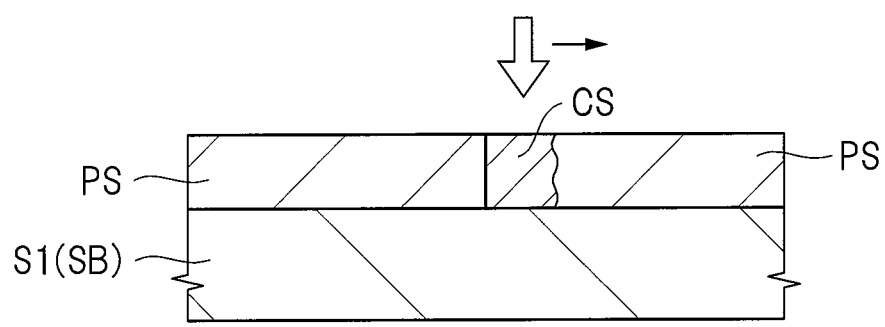
FIG. 22B is a cross-sectional view showing the method of manufacturing the SOI substrate of the second application example.
Figure 22C:
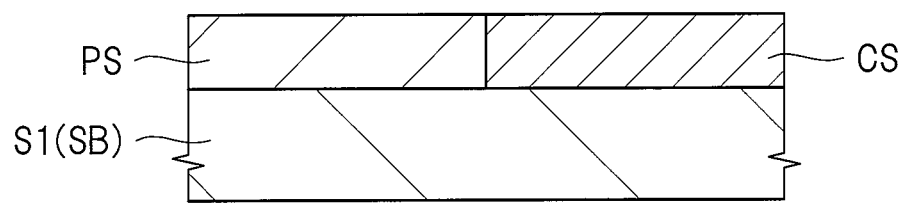
FIG. 22C is a cross-sectional view showing the method of manufacturing the SOI substrate of the second application example.

A first silicon substrate S1 shown in FIG. 22A is prepared, and a polycrystalline silicon layer PS is formed on the upper surface thereof by using the CVD or the like. The film thickness of the polycrystalline silicon layer PS is approximately 1 μm, for example. Next, as shown in FIG. 22B, by selectively emitting an energy ray such as a laser beam, a part of the polycrystalline silicon layer PS is single-crystallized. Accordingly, the single-crystal silicon film CS can partially be formed (FIG. 22C). The film thickness of the single-crystal silicon film CS is approximately 1 μm, for example.

Also, a second silicon substrate S2 is prepared, and the upper surface thereof is oxidized to form an insulating layer BOX composed of a silicon oxide film (see FIG. 14C). The film thickness of the insulating layer BOX is approximately 1 μm, for example.

Figure 23A:
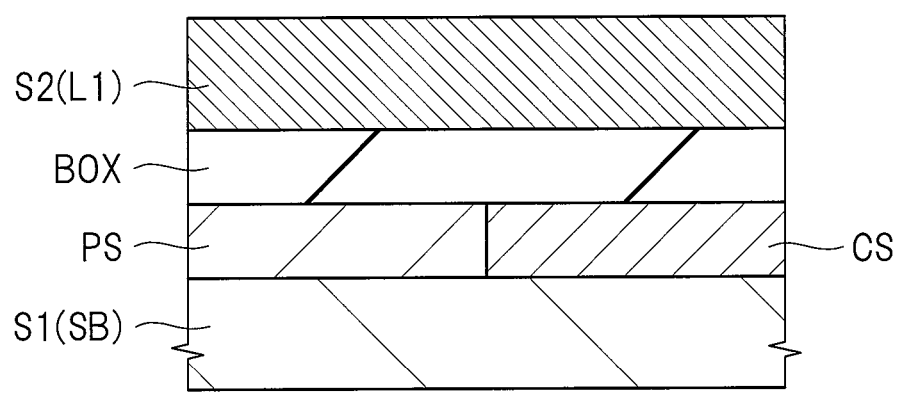
FIG. 23A is a cross-sectional view showing the method of manufacturing the SOI substrate of the second application example.
Figure 23B:
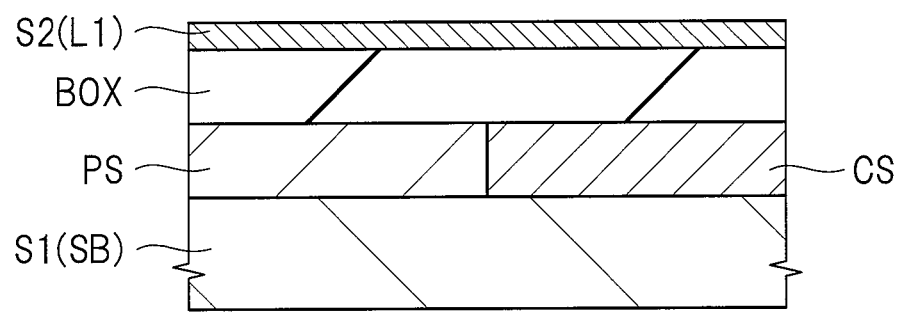
FIG. 23B is a cross-sectional view showing the method of manufacturing the SOI substrate of the second application example.

Next, as shown in FIG. 23A, the polycrystalline silicon layer PS and the single-crystal silicon film. CS on the upper surface side of the first silicon substrate S1 are pressure-bonded to the insulating layer BOX on the upper surface side of the second silicon substrate S2 under high temperature. Thereafter, as shown in FIG. 23B, the second silicon substrate S2 is arranged to be the upper surface of the SOI substrate SB and made thin by using the CMP or the like. In this case, a thin film which is the second silicon substrate S2 remains on the insulating layer BOX. The thin film serves as the semiconductor layer L1. The thickness of the thin film (L1) which is the second silicon substrate S2 is set to be approximately 300 nm, for example.

Thus, the SOI substrate SB composed of a laminated layer of the semiconductor layer L1, the insulating layer BOX, the silicon layer (the polycrystalline silicon layer PS and the single-crystal silicon film. CS), and the first silicon substrate S1 can be formed.

Also, since the configurations and manufacturing processes of the optical signal transmission line section PR1, the optical modulation section PR2, and the photoelectric conversion section PR3 formed in the semiconductor layer L1 of the SOI substrate SB are the same as the case in the first embodiment, the description thereof is omitted here.

Note that, although a single crystallization is performed by using an energy ray in the present application example, a single crystallization may be performed by curing (heat treatment) or the like. For example, by covering the region in which a single crystallization is not required with an insulating film and the like and curing, a desired region can be single-crystallized.

Note that the configuration of the polycrystalline silicon layer PS in the above first application example shown in FIGS. 17 and 18 and the configuration of the single-crystal silicon film CS in the present application example may be combined. In this case, after the process shown in FIG. 22C, the silicon layers (PS and CS) are selectively removed as shown in FIGS. 19B and 19C, and an insulating layer is embedded in the opening portions. Thus, by adjusting the forming regions of the silicon layers (PS and CS), the film stress due to the laminated layer of the silicon layers (PS and CS) and the insulating layer BOX can be adjusted.

Third Application Example

Although the polycrystalline silicon layer PS is all single-crystallized in its thickness direction in the photoelectric conversion section PR3 in the second application example (FIGS. 21 to 23B), the upper surface part of the polycrystalline silicon layer PS only may be single-crystallized.

Figure 24:
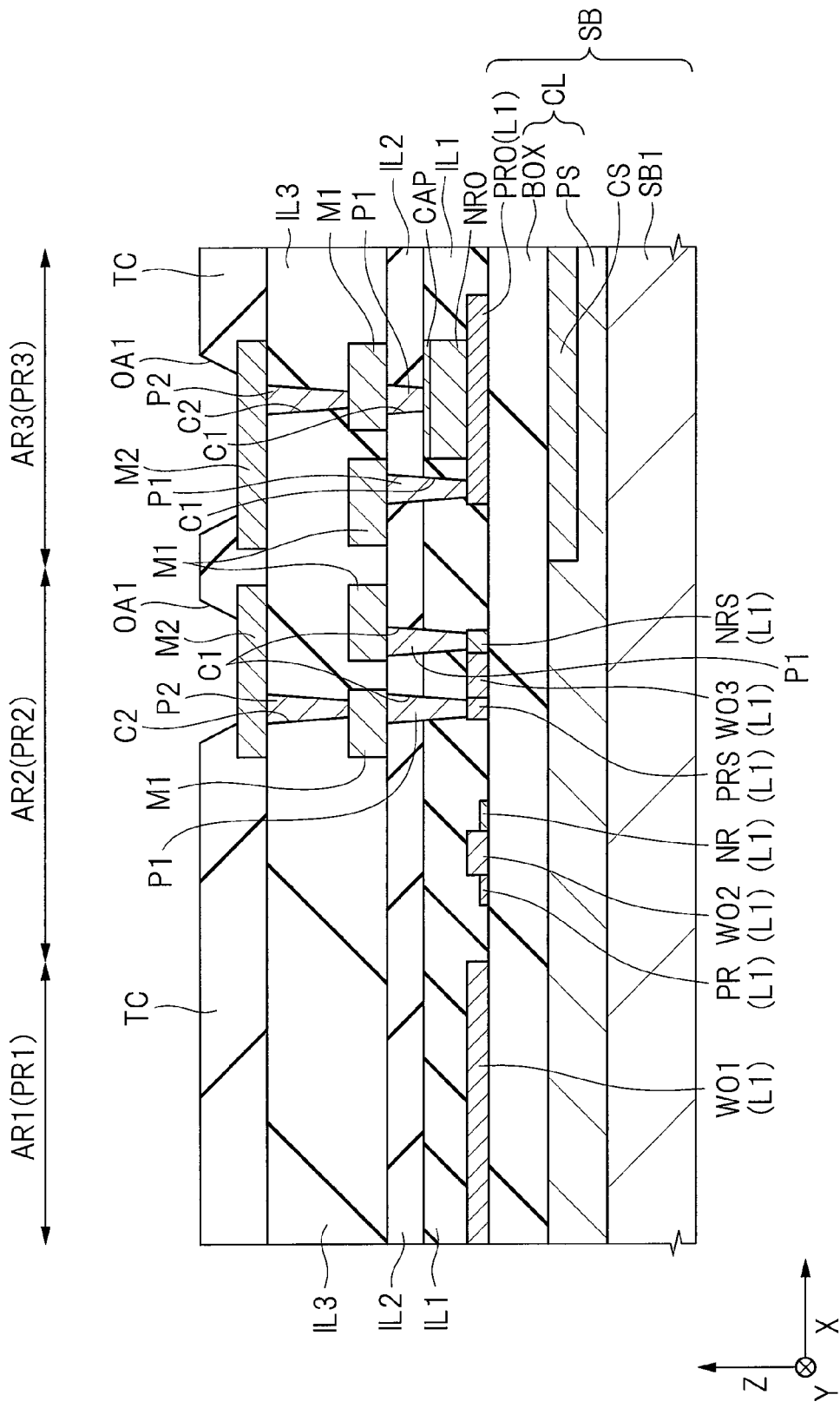
FIG. 24 is a cross-sectional view showing a configuration of a semiconductor device of a third application example of the second embodiment.

FIG. 24 is a cross-sectional view showing a configuration of a semiconductor device of a third application example of the present embodiment.

Although a silicon layer is provided on the entire surface of the base substrate SB1 in the semiconductor device shown in FIG. 24, the region in which the polycrystalline silicon layer PS is provided and the region in which the single-crystal silicon film CS is provided are present on the base substrate SB1.

Here, the polycrystalline silicon layer PS is provided on the base substrate SB1 in the regions AR1 and AR2, that is, in the optical signal transmission line section PR1 in which the optical waveguide WO1 is formed and the optical modulation section PR2 in which the optical waveguides WO2 and WO3 are formed, but the single-crystal silicon film CS is provided on the upper surface part of the polycrystalline silicon layer PS over the base substrate SB1 in the regions AR3, that is, in the photoelectric conversion section PR3. The film thickness of the single-crystal silicon film CS in the photoelectric conversion section PR3 is smaller than that of the polycrystalline silicon layer PS in the optical signal transmission line section PR1 and the optical modulation section PR2. Also, the polycrystalline silicon layer PS is present between the single-crystal silicon film CS and the base substrate SB1.

Thus, by providing the polycrystalline silicon layer PS at required places (specifically, below the optical waveguides WO1, WO2, and WO3), reflection (diffusion) of light leaked out beyond the insulating layer BOX can be suppressed like the second application example. Moreover, by providing the single-crystal silicon film CS having a high reflectance on the upper surface part of the polycrystalline silicon layer PS in the photoelectric conversion section PR3, the leaked light leaked out beyond the insulating layer BOX can be reflected. Accordingly, the reflected light enters the photoelectric conversion section PR3 again, so that photoelectric conversion efficiency can be improved.

Specifically, when light enters the element with a pn junction structure from the upward direction of the SOI substrate SB, the reflected light can be efficiently utilized, so that photoelectric conversion efficiency can be improved.

(Method of Manufacturing an SOI Substrate)

A method of forming the SOI substrate SB including the polycrystalline silicon layer PS and the single-crystal silicon film CS is not limited, and the SOI substrate SB is formed in the manner described below, for example.

FIGS. 25A, 25B, 26A, and 26B are cross-sectional views showing a method of manufacturing the SOI substrate of the present application example.

Figure 25A:
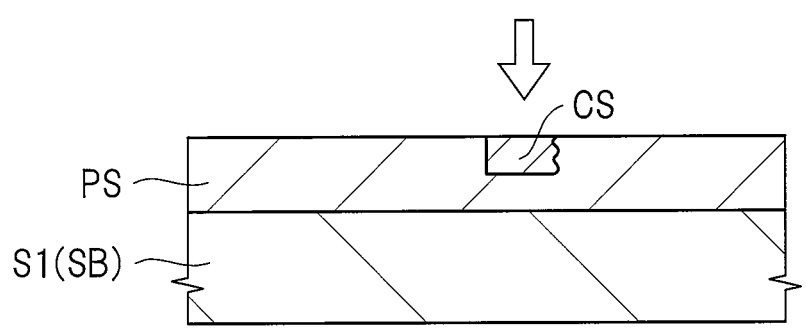
FIG. 25A is a cross-sectional view showing a method of manufacturing an SOI substrate of the third application example.
Figure 25B:
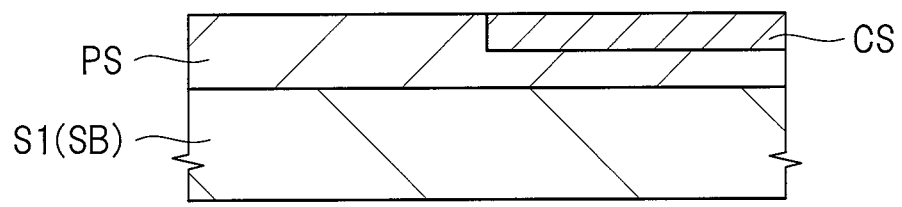
FIG. 25B is a cross-sectional view showing the method of manufacturing the SOI substrate of the third application example.

As shown in FIG. 25A, a first silicon substrate S1 is prepared, and a polycrystalline silicon layer PS is formed on the upper surface thereof by using the CVD or the like. The film thickness of the polycrystalline silicon layer PS is approximately 1 μm, for example. Next, by selectively emitting an energy ray such as a laser beam, a part of the upper surface of the polycrystalline silicon layer PS is single-crystallized. Accordingly, only the upper surface of the polycrystalline silicon layer PS can be single-crystallized (FIG. 25B). The film thickness of the single-crystal silicon film CS is approximately 0.5 μm, for example.

Also, a second silicon substrate S2 is prepared, and the upper surface thereof is oxidized to form an insulating layer BOX composed of a silicon oxide film (see FIG. 14C). The film thickness of the insulating layer BOX is approximately 1 μm, for example.

Figure 26A:
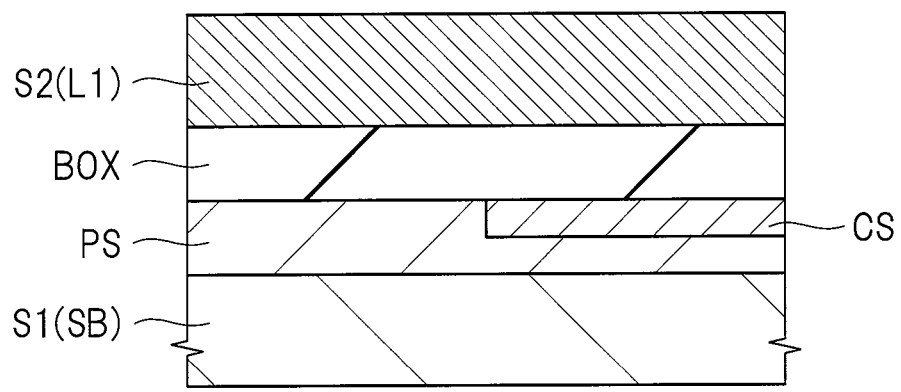
FIG. 26A is a cross-sectional view showing the method of manufacturing the SOI substrate of the third application example.
Figure 26B:
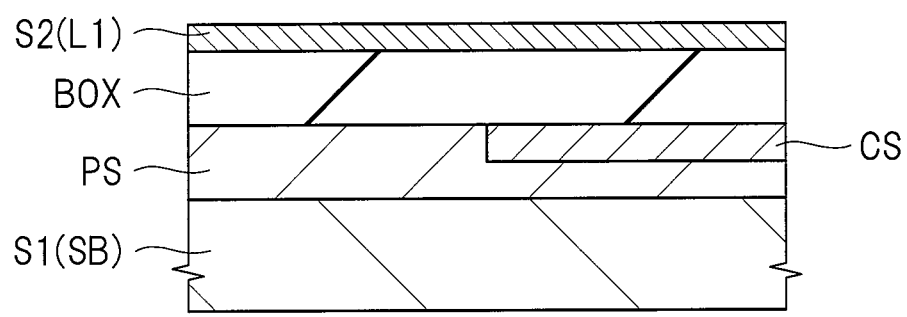
FIG. 26B is a cross-sectional view showing the method of manufacturing the SOI substrate of the third application example.

Next, as shown in FIG. 26A, the polycrystalline silicon layer PS and the single-crystal silicon film CS on the upper surface side of the first silicon substrate S1 are pressure-bonded to the insulating layer BOX on the upper surface side of the second silicon substrate S2 under high temperature. Thereafter, as shown in FIG. 26B, the second silicon substrate S2 is arranged to be the upper surface of the SOI substrate SB and made thin by using the CMP or the like. In this case, a thin film which is the second silicon substrate S2 remains on the insulating layer BOX. This thin film serves as the semiconductor layer L1. The thickness of the thin film (L1) which is the second silicon substrate S2 is set to be approximately 300 nm, for example.

Thus, the SOI substrate SB composed of a laminated layer of the semiconductor layer L1, the insulating layer BOX, the silicon layer (the polycrystalline silicon layer PS and the single-crystal silicon film CS), and the first silicon substrate S1 can be formed.

Also, since the configurations and manufacturing processes of the optical signal transmission line section PR1, the optical modulation section PR2, and the photoelectric conversion section PR3 formed in the semiconductor layer L1 of the SOI substrate SB are the same as the case in the first embodiment, the description thereof is omitted here.

Note that the configuration of the polycrystalline silicon layer PS in the above first application example shown in FIGS. 17 and 18 and the configuration of the single-crystal silicon film CS in the present application example may be combined. In this case, after the process shown in FIG. 25B, the silicon layers (PS and CS) are selectively removed as shown in FIGS. 19B and 19C, and an insulating layer is embedded in the opening portions. Thus, by adjusting the forming regions of the silicon layers (PS and CS), the film stress due to the laminated layer of the silicon layers (PS and CS) and the insulating layer BOX can be adjusted.

Figure 27:
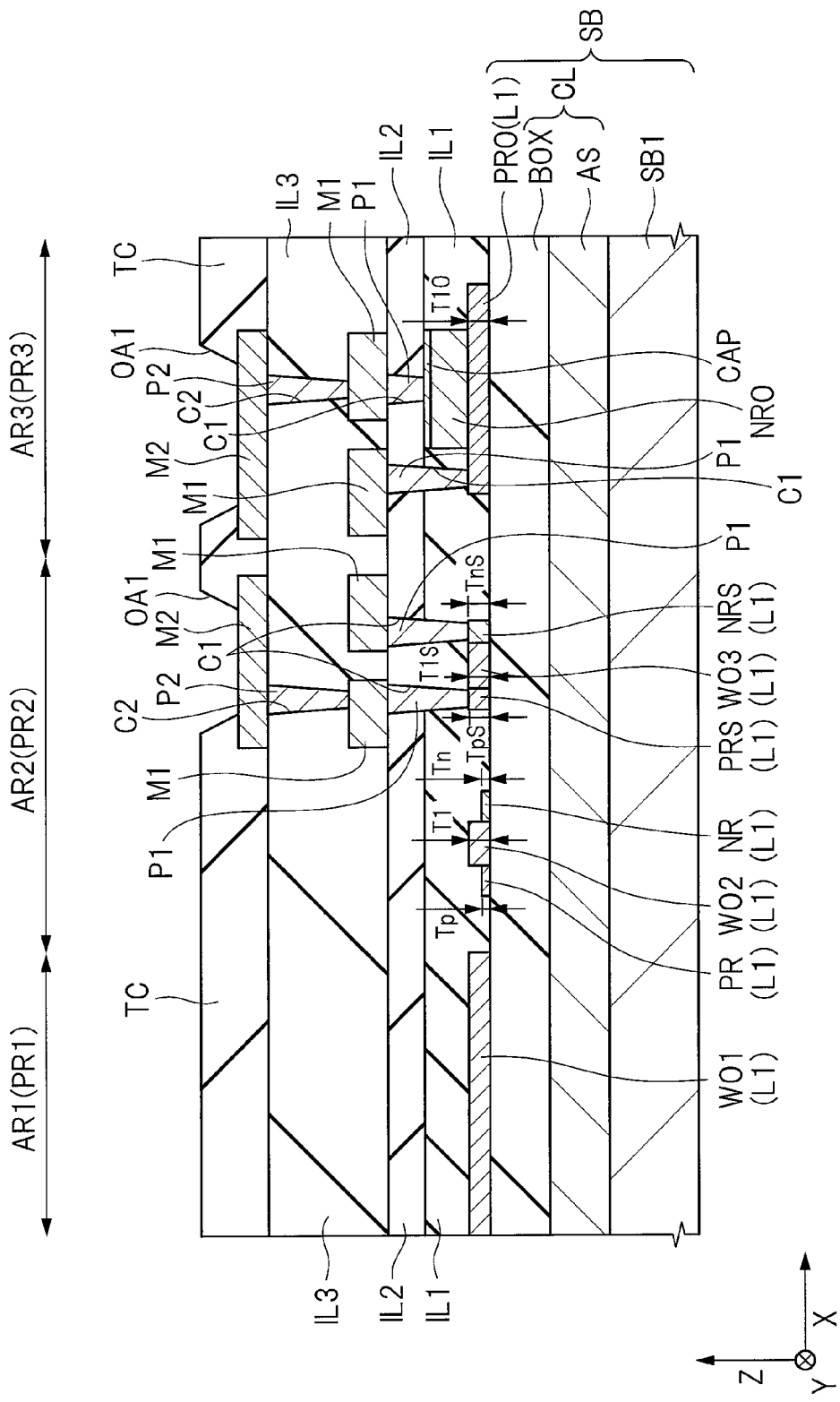
FIG. 27 is a cross-sectional view showing a configuration of a semiconductor device of another embodiment.

Here, although the polycrystalline silicon layer PS is used so as to suppress reflection (diffusion) of light leaked out beyond the insulating layer BOX in the above first embodiment, an amorphous silicon layer AS may be used instead of the polycrystalline silicon layer PS. FIG. 27 is a cross-sectional view showing a configuration of a semiconductor device of another embodiment. As shown in FIG. 27, when the polycrystalline silicon layer PS is replaced by the amorphous silicon layer AS, the same effect in the first embodiment can be achieved. Also, the polycrystalline silicon layer PS may be replaced by the amorphous silicon layer AS in each application example of the second embodiment as well.

In the foregoing, the invention made by the inventors of the present invention has been concretely described based on the embodiments. However, it is needless to say that the present invention is not limited to the foregoing embodiments and various modifications and alterations can be made within the scope of the present invention.

What is claimed is:

1. A semiconductor device comprising:
   a base substrate;
   a polycrystalline silicon layer formed on the base substrate;
   an insulating layer formed on the polycrystalline silicon layer;
   a semiconductor layer formed on the insulating layer;
   an optical waveguide formed in the semiconductor layer;
   a third semiconductor portion which is formed in the semiconductor layer and is of a first conductivity type; and
   a fourth semiconductor portion which is formed on the third semiconductor portion and is of a second conductivity type opposite to the first conductivity type.

2. The semiconductor device according to claim 1, comprising:
   a first semiconductor portion and a second semiconductor portion arranged on opposite sides of the optical waveguide and formed in the semiconductor layer.

3. The semiconductor device according to claim 2, wherein the polycrystalline silicon layer is arranged below the optical waveguide, the first semiconductor portion, and the second semiconductor portion.

4. The semiconductor device according to claim 2, wherein the polycrystalline silicon layer is arranged below the optical waveguide and is not arranged below the first semiconductor portion and the second semiconductor portion.

5. The semiconductor device according to claim 1, wherein the semiconductor layer is made of Si, and wherein the fourth semiconductor portion is made of Ge.

6. The semiconductor device according to claim 1, wherein the polycrystalline silicon layer is arranged below the optical waveguide and the third semiconductor portion.

7. The semiconductor device according to claim 1, wherein the polycrystalline silicon layer is arranged below the optical waveguide and is not arranged below the third semiconductor portion.

8. The semiconductor device according to claim 7, wherein a film thickness of the insulating layer below the optical waveguide is smaller than a film thickness of the insulating layer below the third semiconductor portion.

9. The semiconductor device according to claim 1, wherein the polycrystalline silicon layer is arranged below the optical waveguide, and
   wherein a single-crystal silicon layer, which is located in the same layer as the polycrystalline silicon layer, is arranged below the third semiconductor portion.

10. The semiconductor device according to claim 9, wherein a film thickness of the polycrystalline silicon layer is approximately the same as a film thickness of the single-crystal silicon layer.

11. The semiconductor device according to claim 9,
wherein a film thickness of the single-crystal silicon layer is smaller than a film thickness of the polycrystalline silicon layer.

12. The semiconductor device according to claim 11,
wherein the polycrystalline silicon layer is arranged under the single-crystal silicon layer.

13. A semiconductor device comprising:
a base substrate;
a polycrystalline silicon layer formed on the base substrate;
an insulating layer formed on the polycrystalline silicon layer;
a semiconductor layer formed on the insulating layer;
an optical waveguide formed in the semiconductor layer; and
a first semiconductor portion and a second semiconductor portion arranged on opposite sides of the optical waveguide and formed in the semiconductor layer,
wherein the polycrystalline silicon layer is arranged below the optical waveguide and is not arranged below the first semiconductor portion and the second semiconductor portion, and
wherein a film thickness of the insulating layer below the optical waveguide is smaller than a film thickness of the insulating layer below the first semiconductor portion and a film thickness of the insulating layer below the second semiconductor portion.

14. A semiconductor device comprising:
a base substrate;
an amorphous silicon layer formed on the base substrate;
an insulating layer formed on the amorphous silicon layer;
a semiconductor layer formed on the insulating layer;
an optical waveguide formed in the semiconductor layer;
a third semiconductor portion which is formed in the semiconductor layer and is of a first conductivity type; and
a fourth semiconductor portion which is formed on the third semiconductor portion and is of a second conductivity type opposite to the first conductivity type.

* * * * *